(12) United States Patent
Endo

(10) Patent No.: US 7,109,492 B2
(45) Date of Patent: Sep. 19, 2006

(54) RADIOGRAPHIC APPARATUS

(75) Inventor: Tadao Endo, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/387,794

(22) Filed: Mar. 24, 2006

(65) Prior Publication Data

US 2006/0165219 A1 Jul. 27, 2006

Related U.S. Application Data

(62) Division of application No. 10/719,123, filed on Nov. 21, 2003, now Pat. No. 7,042,980.

(30) Foreign Application Priority Data

Nov. 22, 2002 (JP) .............................. 2002-339817

(51) Int. Cl.
*G01T 1/24* (2006.01)
*H01L 25/00* (2006.01)
*H01L 27/146* (2006.01)
(52) U.S. Cl. ................................. 250/370.09
(58) Field of Classification Search ............ 250/370.09
See application file for complete search history.

(56) References Cited

U.S. PATENT DOCUMENTS

| 5,742,058 | A | 4/1998 | Pantigny et al. |
| 5,841,180 | A | 11/1998 | Kobayashi et al. |
| 5,990,489 | A | 11/1999 | Tashiro |
| 6,044,128 | A | 3/2000 | Tanaka et al. |
| 6,084,939 | A | 7/2000 | Tamura |
| 6,163,029 | A | 12/2000 | Yamada et al. |
| 6,163,386 | A | 12/2000 | Kobayashi et al. |
| 6,510,202 | B1 | 1/2003 | Tamura et al. |
| 6,818,899 | B1 | 11/2004 | Endo |
| 6,952,464 | B1 | 10/2005 | Endo |
| 2002/0050940 | A1 | 5/2002 | Sato et al. |
| 2002/0186813 | A1 | 12/2002 | Tamura et al. |
| 2006/0115048 | A1* | 6/2006 | Endo .................... 378/98.8 |

FOREIGN PATENT DOCUMENTS

| EP | 0792062 A2 | 8/1997 |
| EP | 1267411 A2 | 12/2002 |

* cited by examiner

*Primary Examiner*—David Porta
*Assistant Examiner*—Mark R. Gaworecki
(74) *Attorney, Agent, or Firm*—Morgan & Finnegan, LLP

(57) ABSTRACT

An object of this invention is to implement a radiographic apparatus which can stably obtain a moving image at a high speed by suppressing a voltage variation in GND or power supply line and omitting the standby period for each frame. To achieve this object, during a period after electrical signals from conversion elements (S1-1-S1-3) in one control interconnection (G1) are transferred and read for each row by a driving circuit section (SR1) before electrical signals in the next control interconnection are transferred and read, the read-accessed conversion elements are refreshed for each row, thereby eliminating the necessity for preparing a refresh period in acquiring continuous moving images. In addition, since the conversion elements are refreshed for each row, the dark current (transient current) in the refresh mode can be made small as compared to a case wherein all the conversion elements are refreshed at once. With this arrangement, the voltage variation in GND or power supply line is suppressed.

12 Claims, 30 Drawing Sheets

RADIOGRAPHIC APPARATUS

This is a divisional application of prior application Ser. No. 10/719,123, filed on Nov. 21, 2003, now U.S. Pat. No. 7,042,980, which is hereby incorporated by reference.

FIELD OF THE INVENTION

The present invention relates to a radiographic apparatus which can suitably be used for medical diagnosis or industrial nondestructive inspection. In this specification, radiation includes electromagnetic waves such as X-rays and γ-rays, or α-rays and β-rays.

BACKGROUND OF THE INVENTION

Conventional X-ray imaging systems installed in hospitals and the like can be classified into a film photographing scheme which irradiates a patient with X-rays and exposes the X-rays transmitted through the patient to a film and an image processing scheme which converts X-rays transmitted through a patient into an electrical signal and executes digital image processing.

An example of apparatuses using the image processing scheme is a radiographic apparatus comprising a phosphor which converts X-rays into visible light and a photoelectric conversion device which converts the visible light into an electrical signal. The phosphor is irradiated with X-rays that have passed through a patient. The internal information of the patient, which is converted into visible light by the phosphor, is output from the photoelectric conversion device as an electrical signal. When the internal information of the patient is converted into an electrical signal, the electrical signal can be converted into digital data by an A/D converter. In this case, the X-ray image information to be used for recording, display, printing, and diagnosis can be handled as digital values.

Recently, radiographic apparatuses in which an amorphous silicon semiconductor thin film is used in a photoelectric conversion device have been put into practical use.

FIG. 24 is a plan view of a conventional photoelectric conversion substrate formed by using amorphous silicon semiconductor thin films as the materials of a MIS photoelectric conversion element 101 and switch element 102. FIG. 24 also shows interconnections that connect the elements.

FIG. 25 is a sectional view taken along a line A-B in FIG. 24. For the sake of simplicity, the MIS photoelectric conversion element will simply be referred to as a photoelectric conversion element hereinafter.

As shown in FIG. 25, the photoelectric conversion element 101 and switch element 102 (amorphous silicon TFT; to simply be referred to as a TFT hereinafter) are formed on a single substrate 103. The lower electrode of the photoelectric conversion element 101 is formed from a first metal thin-film layer 104 that is the same as the layer that forms the lower electrode (gate electrode) of the TFT 102. The upper electrode of the photoelectric conversion element 101 is formed from a second metal thin-film layer 105 that is the same as the layer that forms the upper electrode (source and drain electrodes) of the TFT 102.

The first and second metal thin-film layers 104 and 105 are also shared by a gate driving interconnection 106 and matrix signal interconnection 107 in the photoelectric conversion circuit section shown in FIG. 24. FIG. 24 shows 2×2=4 pixels. The hatched portions in FIG. 24 indicate the light-receiving surfaces of the photoelectric conversion elements 101. A power supply line 109 supplies a bias to the photoelectric conversion element 101. A contact hole 110 connects the photoelectric conversion element 101 to the TFT 102.

When the structure shown in FIG. 24, which mainly uses an amorphous silicon semiconductor, is used, the photoelectric conversion element 101, TFT 102, gate driving interconnection 106, and matrix signal interconnection 107 can be simultaneously formed on a single substrate. The photoelectric conversion circuit section having a large area can easily be provided at a low cost.

The device operation of the photoelectric conversion element 101 will be described next with reference to FIG. 26. In FIG. 26, a to c show a graph showing energy bands so as to explain the device operation of the photoelectric conversion element 101 shown in FIGS. 24 and 25.

In FIG. 26, a and b show the operations in a refresh mode and in a photoelectric conversion mode, respectively. The abscissa indicates the states of the respective layers shown in FIG. 25 in the direction of film thickness. M1 indicates a lower electrode (G electrode) formed from the first metal thin-film layer 104 of, e.g., Cr. An amorphous silicon nitride (a-SiNx) insulating thin-film layer 111 is an insulating layer that inhibits the passage of both electrons and holes. The amorphous silicon nitride insulating thin-film layer 111 must be so thick as not to generate a tunneling effect. Genarally, the thickness is 50 nm or more.

A hydrogenated amorphous silicon (a-Si:H) thin-film layer 112 is a photoelectric conversion semiconductor layer formed from an intrinsic semiconductor layer (i-layer) for which doping is intentionally unexecuted. An N+ layer 113 is an injection inhibiting layer which inhibits injection of carriers of single conductivity type. The N+ layer 113 is made of an amorphous semiconductor such as an n-type hydrogenated amorphous silicon thin-film layer that is formed to prevent hole injection to the hydrogenated amorphous silicon thin-film layer 112. M2 indicates an upper electrode (D electrode) formed from the second metal thin-film layer 105 of, e.g., Al.

Referring to FIG. 25, the D electrode serving as an upper electrode does not completely cover the N+ layer 113. However, since electrons can freely move between the D electrode and the N+ layer 113, the D electrode and N+ layer 113 always have an equipotential. A description will be done below on the basis of this condition. The device operation of the photoelectric conversion element 101 includes two operation modes, i.e., a refresh mode and a photoelectric conversion mode. These modes are based on the manner a voltage is applied to the D electrode or G electrode.

In the refresh mode shown in a of FIG. 26, a negative potential with respect to the G electrode is applied to the D electrode. Holes in the i-layer 112, which are indicated by filled circles in a of FIG. 26, are guided to the D electrode by the electric field. Simultaneously, electrons indicated by open circles in a of FIG. 26 are injected to the i-layer 112. At this time, some holes and electrons recombine in the N+ layer 113 and i-layer 112 and vanish. If this state continues for a sufficiently long time, the holes are swept from the i-layer 112.

To change the above-described state to the photoelectric conversion mode shown in b of FIG. 26, a positive potential with respect to the G electrode is applied to the D electrode. Accordingly, electrons in the i-layer 112 are instantaneously guided to the D electrode. However, holes are not guided to the i-layer 112 because the N+ layer 113 acts as an injection inhibiting layer. When light becomes incident on the i-layer 112 in this state, the light is absorbed, and electron-hole pairs are generated. The electrons are guided to the D electrode by the electric field. On the other hand, holes move through the i-layer 112 and reaches the interface between the i-layer 112 and the amorphous silicon nitride (a-SiNx) insulating thin-film layer 111. The holes cannot move into the insulating layer 111 and therefore stay in the i-layer 112. At this time, the electrons move to the D electrode while the holes move to the insulating layer interface in the i-layer. To keep the electrical neutrality in the photoelectric conversion element 101, a current flows from the G electrode. This current corresponds to the electron-hole pairs generated by light and is therefore proportional to the incident light.

After the photoelectric conversion mode shown in b of FIG. 26 is held for a certain period, the refresh mode shown in a of FIG. 26 is set again. The holes staying in the i-layer 112 are guided to the D electrode, as described above. A current corresponding to the holes flows. The number of holes corresponds to the total amount of light that becomes incident during the photoelectric conversion mode. At this time, a current corresponding to the number of electrons injected to the i-layer 112 also flows. This number is almost constant and can be detected by subtraction. That is, the photoelectric conversion element 101 can output the amount of light that becomes incident in real time and also detect the total amount of light that becomes incident during a certain period.

However, if the period of the photoelectric conversion mode becomes too long due to some reason or the illuminance of incident light is high, no current flows in some cases even when light is incident. This is because a number of holes stay in the i-layer 112, the electric field in the i-layer 112 becomes small due to these holes, generated electrons are not guided, and the electrons recombine with the holes in the i-layer 112, as shown in c of FIG. 26. This state is called the saturation state of the photoelectric conversion element 101. When the light incident state changes in this state, the current flow may be unstable. However, when the refresh mode is set again, the holes in the i-layer 112 are swept. In the next photoelectric conversion mode, a current proportional to light flows again.

As described above, if holes in the i-layer 112 should be swept in the refresh mode, all holes are ideally swept. However, an effect can be obtained even by sweeping only some holes. Since a current equal to that in the above description can be obtained, no problem is posed. That is, only, the necessary thing is to prevent the saturation state shown in c of FIG. 26 in the detection opportunity in the next photoelectric conversion mode. To do this, the potential of the D electrode with respect to the G electrode in the refresh mode, the period of the refresh mode, and the characteristic of the N+ layer 113 serving as an injection inhibiting layer are defined.

In the refresh mode, electron injection to the i-layer 112 is not always necessary. In addition, the potential of the D electrode with respect to the G electrode is not limited to a negative potential. When a number of holes are staying in the i-layer 112, the electric field in the i-layer 112 is applied to guide the holes to the D electrode even when the potential of the D electrode with respect to the G electrode is positive. Furthermore, the N+ layer 113 serving as an injection inhibiting layer need not always have a characteristic to inject electrons to the i-layer 112.

FIG. 27 is a circuit diagram showing a conventional photoelectric conversion circuit corresponding to one pixel having the photoelectric conversion element 101 and TFT 102.

Referring to FIG. 27, the photoelectric conversion element 101 includes a capacitance component $C_i$ formed from the i-layer and a capacitance component $C_{SiN}$ formed from the injection inhibiting layer. When the photoelectric conversion element 101 is saturated, i.e., no electric field (small electric field) is formed between the D electrode and a node N (in the i-layer), the junction (the node N shown in FIG. 27) between the i-layer and the injection inhibiting layer cannot store hole carriers because electrons and holes generated by light recombine.

That is, the potential of the node N is never higher than that of the D electrode. To embody the operation in this saturation state, a diode (D1) is connected in parallel to the capacitance component $C_i$ in FIG. 27. That is, the photoelectric conversion element 101 has three constituent elements: capacitance component $C_i$, capacitance component $C_{SiN}$, and diode D1.

FIG. 28 is a timing chart showing the operation of the photoelectric conversion circuit corresponding to one pixel shown in FIG. 27. The circuit operation of the pixel constituted by the photoelectric conversion element 101 and TFT 102 will be described below with reference to FIGS. 27 and 28.

A refresh operation will be described first.

Referring to FIG. 27, Vs is set to 9 V, and Vref is set to 3 V. In the refresh operation, a switch SW-A is set on the Vref side, a switch SW-B is set on the Vg(on) side, and a switch SW-C is turned on. In this state, the D electrode is biased to Vref (6 V), the G electrode is biased to the GND potential, and the node N is biased to the maximum Vref (6 V). Biasing to the maximum voltage means that if the potential of the node N is already equal to or higher than Vref in the photoelectric conversion operation before the current refresh operation, the node N is biased to Vref through the diode D1. If the potential of the node N is lower than Vref in the preceding photoelectric conversion operation, the node N is not biased to the potential Vref by the current refresh operation. In actual use, when the photoelectric conversion operation was repeated a plurality of number of times in the past, the node N is substantially biased to Vref (6 V) by the current refresh operation.

After the node N is biased to Vref, the switch SW-A is switched to the Vs side. Accordingly, the D electrode is biased to Vs (9 V). With this refresh operation, hole carriers stored in the node N of the photoelectric conversion element 101 are swept to the D electrode side.

An X-ray irradiation period will be described next.

As shown in FIG. 28, a subject is irradiated with X-rays as pulses. A phosphor Fl is irradiated with the X-rays that have passed through the subject to be detected so the X-rays are converted into visible light. The semiconductor layer (i-layer) is irradiated with the visible light from the phosphor Fl so the visible light is photoelectrically converted. Hole carriers generated by photoelectric conversion are stored in the node N and increase its potential. Since the TFT 102 is OFF, the potential on the G electrode side increases by the same amount.

The wait period is inserted between the refresh period and the X-ray irradiation period. This period is a standby period in which no elements are operated, and any operation is inhibited until relaxation when the characteristic of the photoelectric conversion element 101 is unstable due to, e.g., a dark current immediately after the refresh operation. When the characteristic of the photoelectric conversion element 101 does not become unstable immediately after the refresh operation, the wait period need not be prepared.

A transfer operation will be described next.

In the transfer operation, the switch SW-B is set on the Vg(on) side to turn on the TFT 102. Accordingly, electron carriers (Se) corresponding to the number (Sh) of hole carriers stored upon X-ray irradiation flow from a $C_2$ side to the G electrode side through the TFT 102 to increase the potential of the read capacitor $C_2$. At this time, Se and Sh hold Se=Sh×$C_{SiN}$/($C_{SiN}$+$C_i$). The potential of the read capacitor $C_2$ is simultaneously amplified and output through an amplifier. The TFT 102 is kept ON for a time enough to transfer the signal charges and then turned off.

A reset operation will be described finally.

In the reset operation, the switch SW-C is turned on, and the read capacitor $C_2$ is reset to the GND potential to prepare for the next transfer operation.

FIG. 29 is a two-dimensional circuit diagram of the conventional photoelectric conversion device.

For the descriptive convenience, FIG. 29 illustrates only 3×3=9 pixels. Reference symbols S1-1 to S3-3 denote photoelectric conversion elements; T1-1 to T3-3, switch elements (TFTs); G1 to G3, gate interconnections to turn on/off the TFTs (T1-1 to T3-3); and M1 to M3, signal interconnections. A Vs line is an interconnection to apply a storage bias or refresh bias to the photoelectric conversion elements S1-1 to S3-3.

The electrode on the solid side of each of the photoelectric conversion elements S1-1 to S3-3 is a G electrode. A D electrode is formed on the opposite side. The D electrodes share part of the Vs line. To send light, a thin N+ layer is used as the D electrodes. The entire structure including the photoelectric conversion elements S1-1 to S3-3, TFTs (T1-1 to T3-3), gate interconnections G1 to G3, signal interconnections M1 to M3, and Vs line is called a photoelectric conversion circuit section 100.

The Vs line is biased by a power supply Vs or power supply Vref. The power supplies are switched by a control signal VSC. A shift register SR1 applies a driving pulse voltage to the gate interconnections G1 to G3. The voltage that turns on the TFTs (T1-1 to T3-3) is externally supplied. The voltage to be supplied is defined by the power supply Vg(on).

A read circuit section 200 amplifies the parallel signal outputs from the signal interconnections M1 to M3 in the photoelectric conversion circuit section 100, converts the parallel signals into serial signals, and outputs them.

Reference symbols RES1 to RES3 are switches which reset the signal interconnections M1 to M3; A1 to A3, amplifiers which amplify the signals from the signal interconnections M1 to M3; CL1 to CL3, sample-and-hold capacitors which temporarily store the signals amplified by the amplifiers A1 to A3; Sn1 to Sn3, switches to execute sample-and-hold operations; B1 to B3, buffer amplifiers; Sr1 to Sr3, switches to convert the parallel signals into serial signals; SR2, a shift register which supplies a pulse for serial conversion to the switches Sr1 to Sr3; and Ab, a buffer amplifier which outputs the serially converted signals.

FIG. 30 is a timing chart showing the operation of the photoelectric conversion device shown in FIG. 29. The operation of the photoelectric conversion device shown in FIG. 29 will be described below with reference to this timing chart.

A control signal VSC applies biases of two types to the Vs line, i.e., the D electrodes of the photoelectric conversion elements S1-1 to S3-3. When the control signal VSC is "Hi", the D electrode is set to Vref(V). When the control signal VSC is "Lo", the D electrode is set to Vs(V). The read power supply Vs(V) and refresh power supply Vref(V) are DC power supplies.

The operation during the refresh period will be described first.

All signals in the shift register SR1 are set to "Hi", and the CRES signal in the read circuit section 200 is set to "Hi". Accordingly, all the TFTs (T1-1 to T3-3) for switching are turned on. In addition, the switch elements RES1 to RES3 in the read circuit section 200 are also turned on. The G electrodes of all the photoelectric conversion elements S1-1 to S3-3 are set to the GND potential. When the control signal VSC changes to "Hi", the D electrodes of all the photoelectric conversion elements S1-1 to S3-3 are biased to the refresh power supply Vref (negative potential). All the photoelectric conversion elements S1-1 to S3-3 are set in the refresh mode, and refresh is performed.

A photoelectric conversion period will be described next.

When the control signal VSC switches to "Lo", the D electrodes of all the photoelectric conversion elements S1-1 to S3-3 are biased to the read power supply Vs (positive potential). The photoelectric conversion elements S1-1 to S3-3 are set in the photoelectric conversion mode. In this state, all the signals in the shift register SR1 are set to "Lo", and the CRES signal in the read circuit section 200 is set to "Lo". Accordingly, all the TFTs (T1-1 to T3-3) for switching are turned off. In addition, the switch elements RES1 to RES3 in the read circuit section 200 are also turned off. The G electrodes of all the photoelectric conversion elements S1-1 to S3-3 are set in a DC open state. However, the potential is held because the photoelectric conversion elements S1-1 to S3-3 also have capacitance components as constituent elements.

At this time, since no light is incident on the photoelectric conversion elements S1-1 to S3-3, no charges are generated. That is, no current flows. When the light source is turned on to emit a pulse, the D electrodes (N+ electrodes) of the photoelectric conversion elements S1-1 to S3-3 are irradiated with light, and a so-called photocurrent flows. The light source is not particularly illustrated in FIG. 29. For, e.g., a copying machine, a fluorescent lamp, LED, or halogen lamp is used. For an X-ray imaging apparatus, an X-ray source is used literally. In this case, a scintillator that converts X-rays into visible light is used. The photocurrent generated by the light is stored in the photoelectric conversion elements S1-1 to S3-3 as charges. The charges are held even after the light source is turned off.

A read period will be described next.

A read operation is performed in the order of the photoelectric conversion elements S1-1 to S1-3 of the first row, the photoelectric conversion elements S2-1 to S2-3 of the second row, and the photoelectric conversion elements S3-1 to S3-3 of the third row.

First, to read the photoelectric conversion elements S1-1 to S1-3 of the first row, a gate pulse is applied from the shift register SR1 to the gate interconnection G1 of the switch elements (TFTs) T1-1 to T1-3. At this time, the high level of the gate pulse equals the externally supplied voltage V(on). Accordingly, the TFTs (T1-1 to T1-3) are turned on. Signal charges stored in the photoelectric conversion elements S1-1 to S1-3 are transferred to the signal interconnections M1 to M3.

Although not particularly illustrated in FIG. 29, a read capacitor is added to each of the signal interconnections M1 to M3. The signal charges are transferred to the read capacitors through the TFTs (T1-1 to T1-3). For example, the read capacitor added to the signal interconnection M1 corresponds to the sum of (three) interelectrode capacitances (Cgs) between the gates and sources of the TFTs (T1-1 to T3-1) connected to the signal interconnection M1. The signal charges transferred to the signal interconnections M1 to M3 are amplified by the amplifiers A1 to A3. The capacitor corresponds to $C_2$ shown in FIG. 27. When the CRES signal is turned on, the signal charges are transferred to the sample-and-hold capacitors CL1 to CL3 and held when the CRES signal is turned off.

When a pulse is applied from the shift register SR2 to the switches Sr1, Sr2, and Sr3 in this order, the signals held by the sample-and-hold capacitors CL1 to CL3 are output from the buffer amplifier Ab in the order of the sample-and-hold capacitors CL1, CL2, and CL3. As a result, photoelectric conversion signals of one row including the photoelectric conversion elements S1-1, S1-2, and S1-3 are sequentially output. The read operation of the photoelectric conversion elements S2-1 to S2-3 of the second row and the read operation of the photoelectric conversion elements S3-1 to S3-3 of the third row are executed in the same way as described above.

When the signals of the signal interconnections M1 to M3 are sampled and held by the sample-and-hold capacitors CL1 to CL3 in accordance with a SMPL signal of the first row, the signal interconnections M1 to M3 can be reset to the GND potential by the CRES signal. After that, a gate pulse can be applied to the gate interconnection G2. That is, while the signals of the first row are serially converted by the shift register SR2, the signal charges in the photoelectric conversion elements S2-1 to S2-3 of the second row can be simultaneously transferred in the shift register SR1.

With the above operation, the signal charges of all the photoelectric conversion elements S1-1 to S3-3 of the first to third rows can be output.

The above-described operation of the X-ray imaging apparatus is an operation for acquiring one still image by executing the refresh operation, irradiating the subject with X-rays, and executing the read operation. To acquire continuous moving images, the timing chart shown in FIG. 30 is repeatedly executed a number of times corresponding to the desired number of moving images.

However, to particularly obtain moving images by using an X-ray imaging apparatus with an enormous number of pixels, the frame frequency must be further increased. If the refresh operation of photoelectric conversion elements is executed through a Vs line common to all the photoelectric conversion elements, one refresh period must be essentially provided in one frame. This decreases the frame frequency, i.e., decreases the operation speed especially in acquiring moving images.

Generally, specifications necessary for simple imaging of a breast part should include an imaging area of 40 cm square or more and a pixel pitch of 200 μm or less. If an X-ray imaging apparatus is constructed with an imaging area of 40 cm square and a pixel pitch of 200 μm, 4,000,000 photoelectric conversion elements are necessary. When such a large number of pixels are refreshed at once, the current that flows in the refresh mode becomes large. Since the voltage variation in GND or power supply line of the X-ray imaging apparatus increases, no stable imaging can be executed.

For an image of a certain type required, an X-ray irradiation standby time must be provided until the voltage variation relaxes. Although not illustrated in FIG. 30, the standby time corresponds to the wait period shown in FIG. 28. That is, to refresh all photoelectric conversion devices at once, one refresh period is necessary in one frame, and additionally, one wait period is necessary in one frame.

SUMMARY OF THE INVENTION

The present invention has been made in consideration of the above-described problems, and has as its object to provide a radiographic apparatus which can stably obtain moving images at a high speed by suppressing the voltage variation in GND and power supply line and omitting the standby time in each frame.

In order to solve the above-described problems and achieve the above object, according to the first aspect of the present invention, there is provided a radiographic apparatus comprising a conversion circuit section in which pixels each including a conversion element that converts incident radiation into an electrical signal and a switch element that transfers the electrical signal are two-dimensionally arrayed, and which comprises a control interconnection that connects the pixels in a row direction and a signal interconnection that reads the electrical signal from the conversion element through the switch element, a driving circuit section which sequentially drives a plurality of control interconnections, and a read circuit section which is connected to a plurality of signal interconnections and reads the electrical signal from the conversion element for each row, wherein the read circuit section includes a refresh device which refreshes each row by applying a first bias to the read-accessed conversion element, and a reset device which executes reset by applying a second bias to the signal interconnection by using at least one reset switch.

According to the second aspect of the present invention, there is provided a radiographic apparatus comprising a conversion circuit section in which pixels each including a conversion element that converts incident radiation into an electrical signal and a first switch element that transfers the electrical signal are two-dimensionally arrayed, and which comprises a control interconnection that connects the pixels in a row direction and a signal interconnection that reads the electrical signal from the conversion element through the first switch element, a driving circuit section which sequentially drives a plurality of control interconnections, and a read circuit section which is connected to a plurality of signal interconnections and reads the electrical signal from the conversion element for each row, wherein the read circuit section comprises a current integration type operational amplifier at a first stage, the operational amplifier comprises, between an inverting terminal and an output terminal, a capacitive element to integrate the electrical signal transferred from the conversion element through the first switch element and a second switch element to reset the capacitive element, and the operational amplifier comprises, at a noninverting terminal, a bias supply device which selectively supplies at least two biases comprising a first bias and a second bias, a refresh device which refreshes each row by applying the first bias to the conversion element read-accessed by using the first switch element and the second switch element, and a reset device which executes reset by applying the second bias to the capacitive element by using the second switch element.

According to the third aspect of the present invention, there is provided a radiographic system comprising a radiation source which irradiates a person or object to be examined with radiation, the above-described radiographic apparatus, which detects the radiation, an image processing apparatus which converts an electrical signal output from the radiographic apparatus into digital data and executes image processing, and a display apparatus which displays the image processed by the image processing apparatus.

According to the fourth aspect of the present invention, there is provided a driving method for a radiographic apparatus having a conversion circuit section in which pixels each including a conversion element that converts incident radiation into an electrical signal and a switch element that transfers the electrical signal are two-dimensionally arrayed, and which comprises a control interconnection that connects the pixels in a row direction and a signal interconnection that reads the electrical signal from the conversion element through the switch element, a driving circuit section which sequentially drives a plurality of control interconnections, and a read circuit section which is connected to a plurality of signal interconnections and reads the electrical signal from the conversion element for each row, comprising a refresh step of refreshing each row by applying a first bias to the conversion element read-accessed by the read circuit section, and a reset step of executing reset by applying a second bias to the signal interconnection by using at least one reset switch.

The present invention has the above-described technical means. During a period after electrical signals from conversion elements in one control interconnection are transferred and read for each row by the driving circuit section (shift register) before electrical signals in the next control interconnection are transferred and read, the conversion elements in the read-accessed control interconnection can be refreshed for each row. For this reason, the necessity for preparing a refresh period in acquiring continuous moving images can be eliminated. With this arrangement, since the frame frequency in acquiring moving images can be increased, moving images can be obtained at a high speed. In addition, since the conversion elements are refreshed for each row, the dark current (transient current) in the refresh mode can be made small as compared to a case wherein all the conversion elements are refreshed at once. With this arrangement, the voltage variation in GND or power supply line is suppressed, and the wait time necessary for relaxing the voltage variation can be omitted.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

The embodiments of a radiographic apparatus according to the present invention will be described next with reference to the accompanying drawings. The embodiments will be described by using, an example, a radiographic apparatus having a substrate on which a photoelectric conversion element array are formed by using amorphous silicon semiconductor thin films as the semiconductor materials of a MIS photoelectric conversion element and a switch element, like the prior art.

(First Embodiment)

Figure 1:
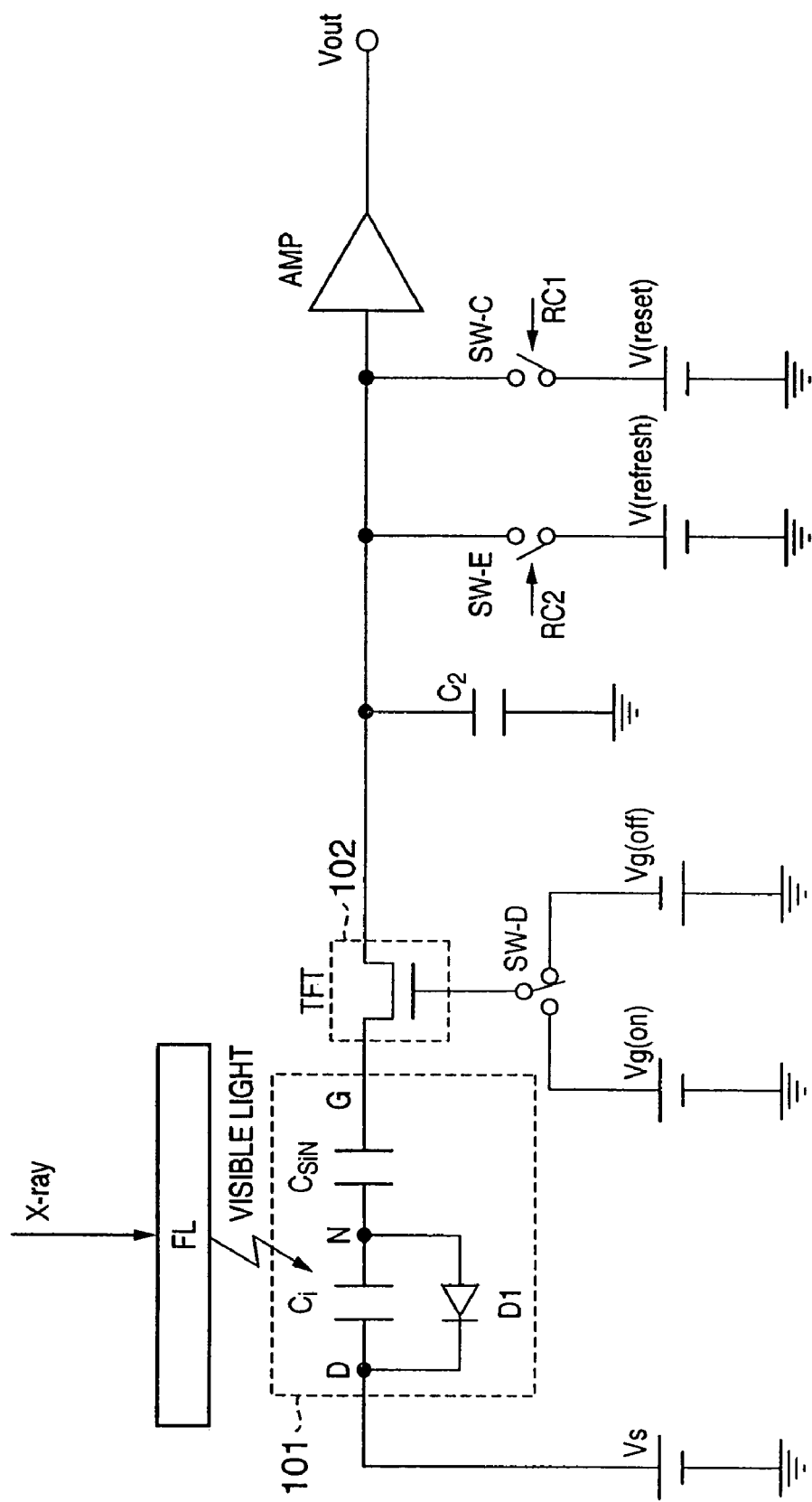
FIG. 1 is an equivalent circuit diagram of one pixel of an X-ray imaging apparatus according to the first embodiment of the present invention.

FIG. 1 is an equivalent circuit diagram of one pixel of an X-ray imaging apparatus according to the first embodiment of the present invention.

As shown in FIG. 1, a photoelectric conversion element 101 includes a capacitance component $C_i$ formed from an i-layer that is made of, e.g., hydrogenated amorphous silicon and serves as a semiconductor photoelectric conversion layer, and a capacitance component $C_{SiN}$ formed from an insulating layer (an injection inhibiting layer which inhibits injection of carriers of both conductivity types) that is made of, e.g., amorphous silicon nitride. When the photoelectric conversion element 101 is saturated, i.e., no electric field (small electric field) is formed between the D electrode and a node N (in the i-layer), the junction (the node N shown in FIG. 1) between the i-layer and the insulating layer cannot store hole carriers because electrons and holes generated by light recombine.

That is, the potential of the node N is never higher than that of the D electrode. To embody the operation in this saturation state, a diode (D1) is connected in parallel to the capacitance component $C_i$ in FIG. 1. That is, the photoelectric conversion element 101 has three constituent elements: capacitance component $C_i$, capacitance component $C_{SiN}$, and diode D1.

A TFT 102 is thin film transistor serving as a switch element. A power supply Vs applies a bias to the D electrode of the photoelectric conversion element 101. A read capacitor $C_2$ is added to the signal interconnection.

A phosphor FL for waveform conversion is used to convert an X-ray wavelength into a visible range wavelength and arranged in direct or indirect contact with the TFT 102. As the matrix material of the phosphor FL, $Gd_2O_2S$ or $Gd_2O_3$ is used. For the luminescent center, a rare-earth element such as $Tb_{3+}$ or $Eu_{3+}$ is used. A phosphor which uses CsI as the matrix material such as CsI:TI or CsI:Na is also used.

A switch SW-C is a reset switch to reset the read capacitor $C_2$ (signal interconnection) to a reset bias V(reset). A switch SW-E is a switch to refresh the photoelectric conversion element (G electrode) to a refresh bias V(refresh). The switches SW-C and SW-E are controlled by an RC1 signal and an RC2 signal, respectively. Vg(on) is a power supply to turn on the TFT 102 to transfer signal charges to the read capacitor $C_2$. Vg(off) is a power supply to turn off the TFT 102. A switch SW-D switches between the power supply Vg(on) and the power supply Vg(off).

To refresh the photoelectric conversion element 101, the switch SW-E must be turned on to supply the refresh bias. Simultaneously, a switch SW-D must be set on the power supply Vg(on) side.

Figure 2:
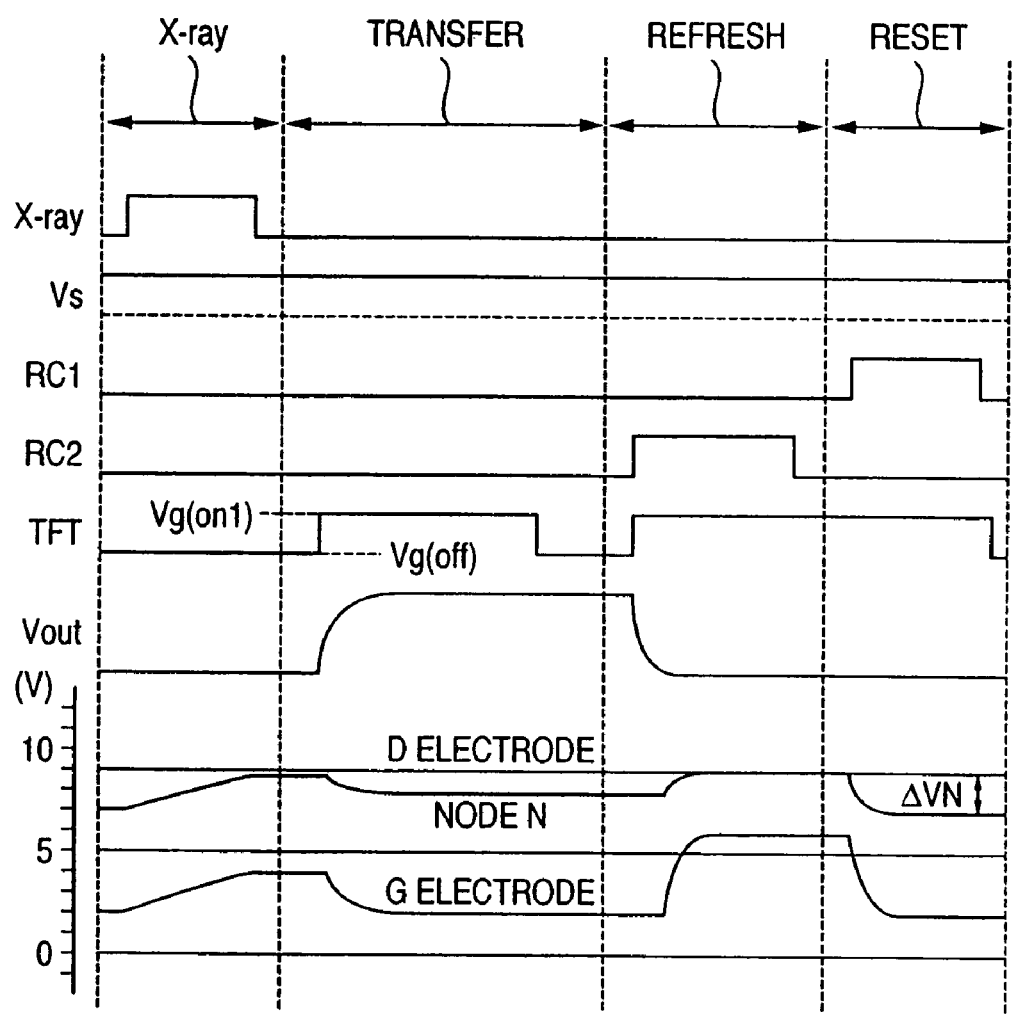
FIG. 2 is a timing chart showing the circuit operation of one pixel of the X-ray imaging apparatus shown in FIG. 1.

FIG. 2 is a timing chart showing the circuit operation of one pixel of the X-ray imaging apparatus shown in FIG. 1.

The circuit operation of one pixel having the photoelectric conversion element 101 and TFT 102 will be described with reference to FIGS. 1 and 2.

An X-ray irradiation period will be described first.

As shown in FIG. 2, a subject is irradiated with X-rays as pulses. The phosphor FL is irradiated with the X-rays that have passed through the subject to be detected so the X-rays are converted into visible light. The semiconductor layer (i-layer) is irradiated with the visible light from the phosphor FL so the visible light is photoelectrically converted. Hole carriers generated by photoelectric conversion are stored in the interface between the i-layer and the insulating layer (injection inhibiting layer) and increase the potential of the node N. Since the TFT 102 is OFF, the potential on the G electrode side increases by the same amount. In the X-ray irradiation period, the switch SW-D is set on the V(off) side, and the switches SW-C and SW-E are turned off.

A transfer operation will be described next.

In the transfer operation, the switch SW-D is set on the Vg(on) side to turn on the TFT 102. Accordingly, electron carriers (Se) corresponding to the number (Sh) of hole carriers stored upon X-ray irradiation flow from a $C_2$ side to the G electrode side through the TFT 102 to increase the potential of the read capacitor $C_2$. At this time, Se and Sh hold Se=Sh×$C_{SiN}$/($C_{SiN}$+$C_i$).

The potential of the read capacitor $C_2$ is mainly formed from a capacitance including the interelectrode capacitances of all the TFTs 102 connected to the signal interconnection. The capacitance is much larger than that of the photoelectric conversion element 101. Hence, the potential increase amount ($\Delta VC_2$) of the read capacitor $C_2$ after charge transfer is much smaller than the potential decrease amount ($\Delta VG$) of the G electrode. More specifically, the potential of the read capacitor $C_2$ after transfer is V(reset)+$\Delta VC_2$. This potential almost equals V(reset). Simultaneously, the potential of the read capacitor $C_2$ is amplified and output through an amplifier. An amplifier (AMP) having the most basic form is illustrated in FIG. 1. The amplifier functions as an amplification circuit. The reset bias V(reset) is not a signal component and is separately canceled. Only $\Delta VC_2$ as a pure signal component is processed as a signal.

A refresh operation will be described next.

The timing chart of FIG. 2 shows the potentials of the D electrode, G electrode, and node N when Vs=9 (V), Vg(reset)=2 (V), and V(refresh)=6 (V) and the capacitance component $C_i$ equals the capacitance component $C_{SiN}$ in the equivalent circuit diagram shown in FIG. 1.

In the refresh operation, the switch SW-C is turned off by the RC1 signal. The switch SW-E is turned on by the RC2 signal. The switch SW-D is set on the Vg(on) side. Accordingly, the potential of the G electrode of the photoelectric conversion element 101 rises from the potential (V(reset)+$\Delta VC_2 \approx$V(reset)=2 (V)) at signal transfer to the refresh bias V(refresh)=6 V. Simultaneously, the potential of the node N also rises but does not exceed Vs=9 V. When the potential of the node N increases, some of the signal charges (hole carriers) stored in the node N are discharged to the D electrode side, so the refresh operation of the photoelectric conversion element 101 is executed.

A reset operation will be described next.

In the reset operation, the switch SW-D is kept on the Vg(on) side. In this state, the switch SW-C is turned on by the RC1 signal, and the switch SW-E is turned off by the RC2 signal. Accordingly, the G electrode of the photoelectric conversion element 101 and the signal interconnection $C_2$ are reset to the reset bias V(reset). Simultaneously, the potential of the node N attenuates from the potential (9 V in FIG. 2) in the refresh operation. The attenuation amount $\Delta VN$ is ½ of the potential difference between V(refresh) and V(reset) when the capacitance component $C_i$ equals the capacitance component $C_{SiN}$. In this description, the decrease amount is 2 V. In addition, the attenuation amount $\Delta VN$ of the node N decides the amount of hole carriers stored in the next photoelectric conversion operation.

Figure 28:
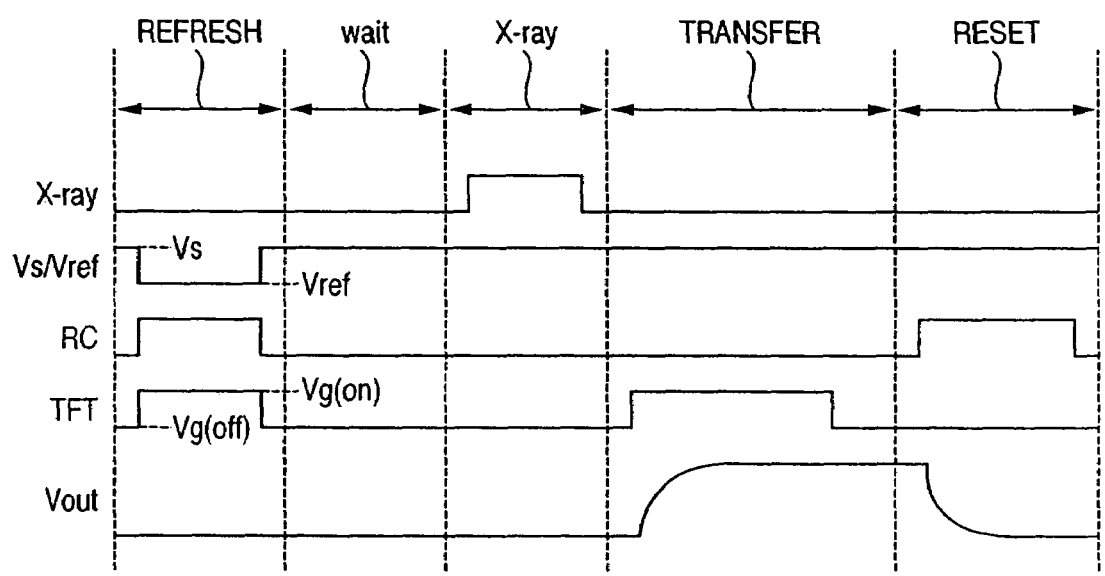
FIG. 28 is a timing chart showing the operation of the photoelectric conversion circuit corresponding to one pixel shown in FIG. 27.
Figure 29:
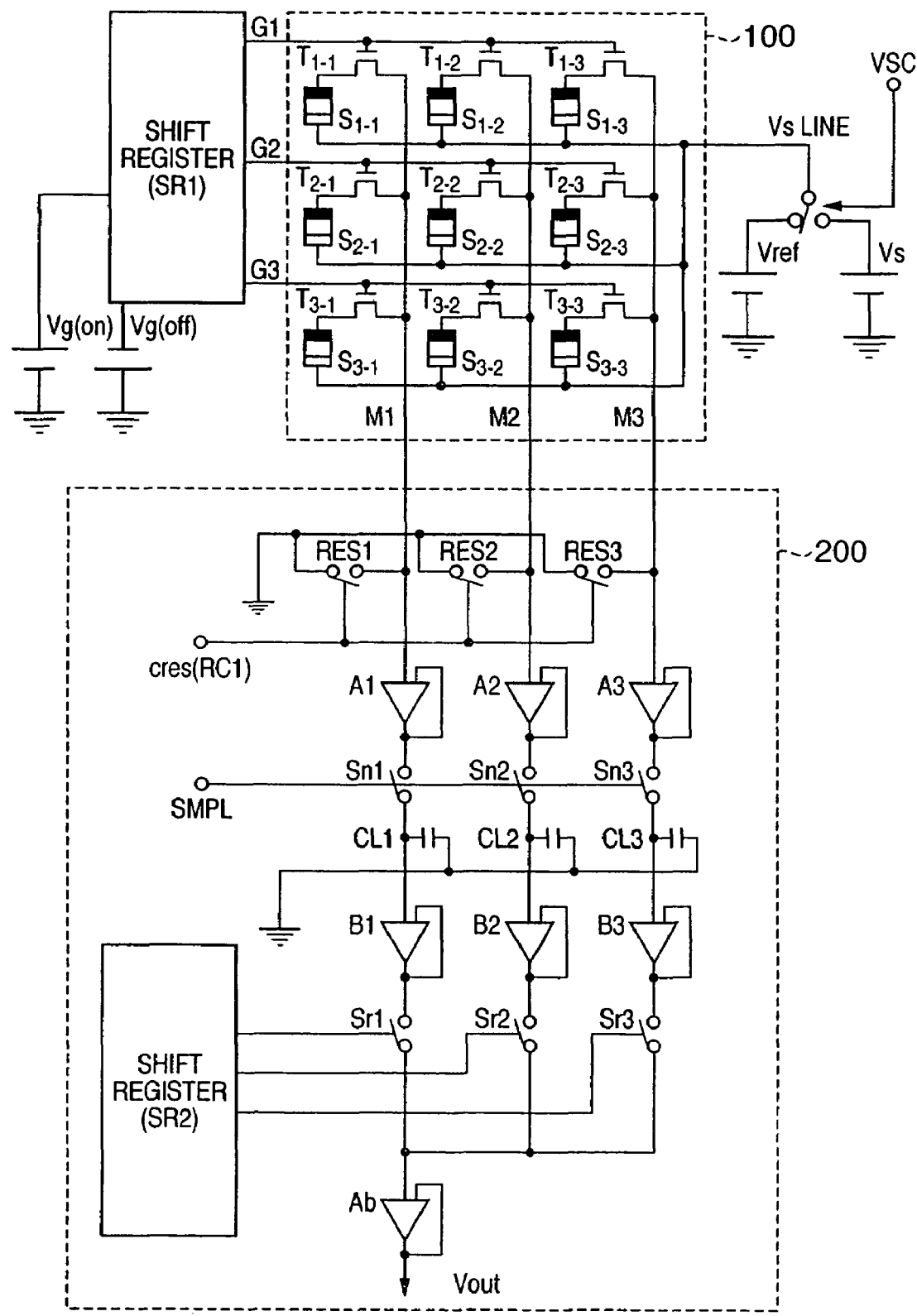
FIG. 29 is a two-dimensional circuit diagram of the conventional photoelectric conversion device.

In FIG. 28 that shows the prior art, the wait period is prepared. However, no wait period is prepared in the timing chart shown in FIG. 2. The reason will be described below with reference to FIGS. 3 and 4.

Figure 3:
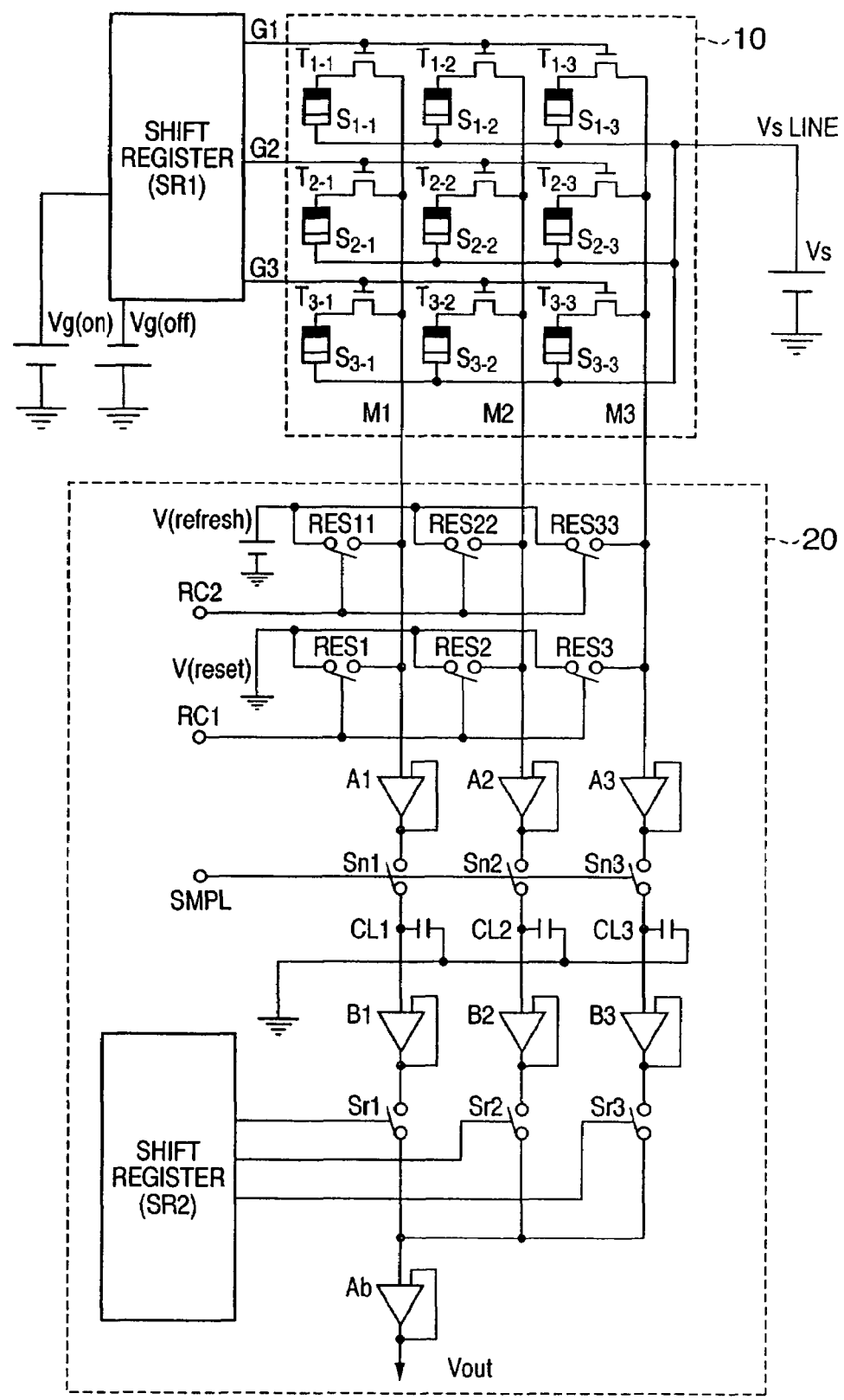
FIG. 3 is an equivalent circuit diagram of the X-ray imaging apparatus according to the first embodiment.

FIG. 3 is an equivalent circuit diagram of the X-ray imaging apparatus according to the first embodiment. For the descriptive convenience, FIG. 3 illustrates only 3×3=9 pixels which are two-dimensionally arrayed in a photoelectric conversion circuit section 10.

Referring to FIG. 3, reference symbols S1-1 to S3-3 denote photoelectric conversion elements; T1-1 to T3-3, switch elements (TFTs); G1 to G3, gate interconnections to turn on/off the TFTs (T1-1 to T3-3); and M1 to M3, signal interconnections. A Vs line is an interconnection to apply a storage bias to the photoelectric conversion elements.

The electrode on the solid side of each of the photoelectric conversion elements S1-1 to S3-3 is a G electrode. A D electrode is formed on the opposite side. The D electrodes share part of the Vs line. To send light, a thin N+ layer is used as the D electrodes. The entire structure including the photoelectric conversion elements S1-1 to S3-3, TFTs (T1-1 to T3-3), gate interconnections G1 to G3, signal interconnections M1 to M3, and Vs line is called the photoelectric conversion circuit section 10.

The Vs line is biased by a power supply Vs. A shift register SR1 applies a driving pulse voltage to the gate interconnections G1 to G3. The voltage Vg(on) that turns on the TFTs (T1-1 to T3-3) and the voltage Vg(off) that turns off the TFTs (T1-1 to T3-3) are externally supplied to the driving circuit section (shift register SR1).

A read circuit section 20 amplifies the parallel signal outputs from the signal interconnections M1 to M3 in the photoelectric conversion circuit section 10, converts the parallel signals into serial signals, and outputs the serial signals.

Reference symbols RES1 to RES3 are switches which reset the signal interconnections M1 to M3 to the reset bias V(reset). The reset bias V(reset) is indicated by 0 V (GND) in FIG. 3. Reference symbols A1 to A3 denote amplifiers which amplify the signals from the signal interconnections M1 to M3; CL1 to CL3, sample-and-hold capacitors which temporarily store the signals amplified by the amplifiers A1 to A3; Sn1 to Sn3, switches to execute sample-and-hold operations; B1 to B3, buffer amplifiers; Sr1 to Sr3, switches to convert the parallel signals into serial signals; SR2, a shift register which supplies a pulse for serial conversion to the switches Sr1 to Sr3; and Ab, a buffer amplifier which outputs the serially converted signals.

Reference symbols RES11 to RES33 are switches to refresh the G electrodes of the photoelectric conversion elements 101 to the refresh bias V(refresh) through the TFTs (T1-1 to T3-3). The refresh bias V(refresh) is connected to one side of each of the switches RES11 to RES33.

Figure 4:
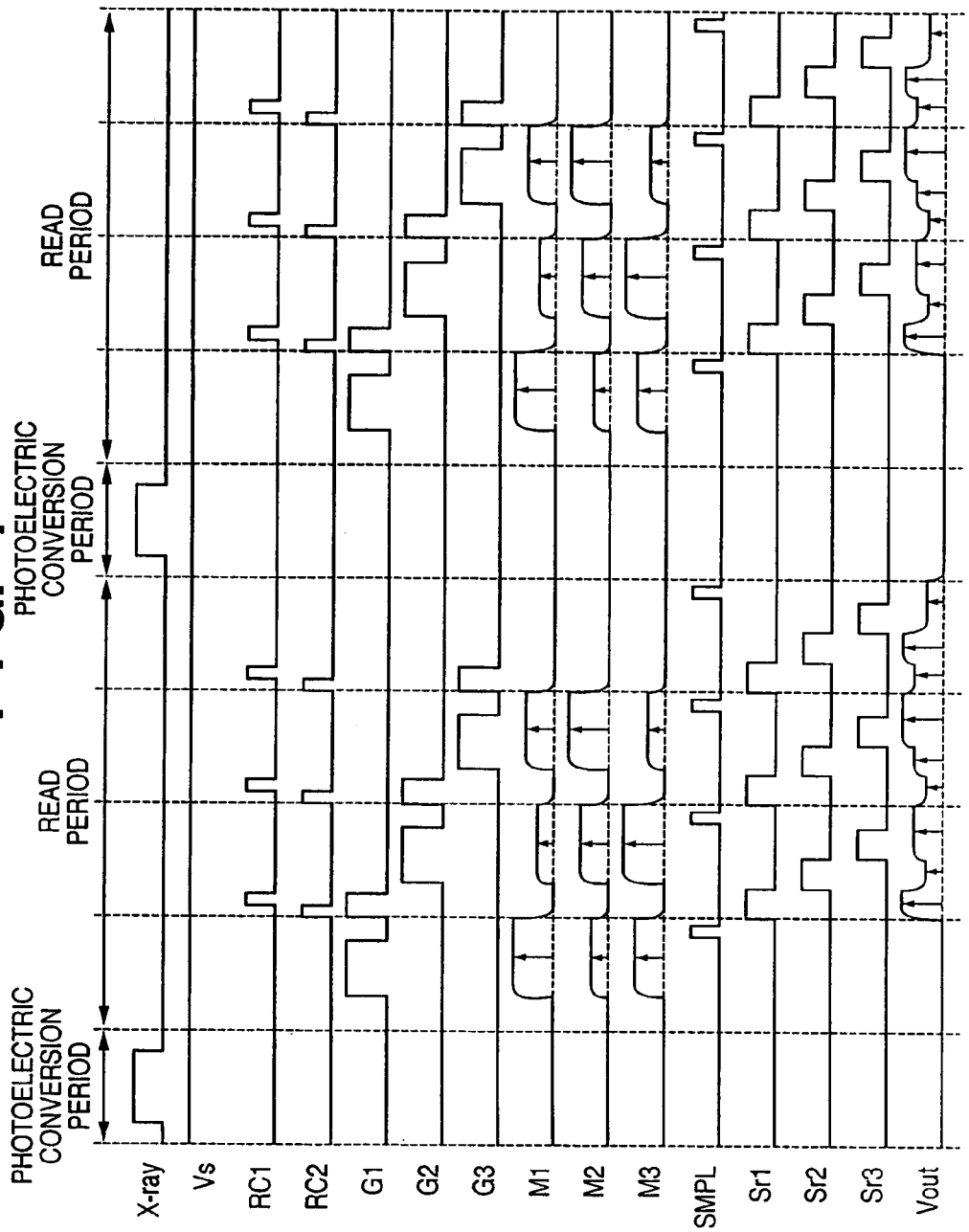
FIG. 4 is a timing chart showing the operation of the X-ray imaging apparatus shown in FIG. 3.

FIG. 4 is a timing chart showing the operation of the X-ray imaging apparatus shown in FIG. 3. FIG. 4 shows the operation of two frames. The operation of the photoelectric conversion device shown in FIG. 3 will be described with reference to this timing chart.

A photoelectric conversion period will be described first.

The D electrodes of all the photoelectric conversion elements S1-1 to S3-3 are biased to the read power supply Vs (positive potential). All signals in the shift register SR1 are "Lo". All the TFTs (T1-1 to T3-3) for switching are OFF. When the light source is turned on in this state to emit a pulse, the D electrodes (N+ electrodes) of the photoelectric conversion elements S1-1 to S3-3 are irradiated with light. Electron and hole carriers are generated in the i-layers of the photoelectric conversion elements S1-1 to S3-3. The electrons are moved to the D electrodes by the read power supply Vs. Holes are stored in the interface between the i-layer and the insulating layer of each of the photoelectric conversion elements S1-1 to S3-3. The holes are held even after the power supply is turned off.

A read period will be described next.

A read operation is performed in the order of the photoelectric conversion elements S1-1 to S1-3 of the first row, the photoelectric conversion elements S2-1 to S2-3 of the second row, and the photoelectric conversion elements S3-1 to S3-3 of the third row.

First, to read the photoelectric conversion elements S1-1 to S1-3 of the first row, a gate pulse is applied from the shift register SR1 to the gate interconnection G1 of the switch elements (TFTs) T1-1 to T1-3. At this time, the high level of the gate pulse equals the externally supplied voltage Vg(on). Accordingly, the TFTs (T1-1 to T1-3) are turned on. Signal charges stored in the photoelectric conversion elements S1-1 to S1-3 are transferred to the signal interconnections M1 to M3.

Although not particularly illustrated in FIG. 3, a read capacitor is added to each of the signal interconnections M1 to M3. The signal charges are transferred to the read capacitors through the TFTs (T1-1 to T1-3). For example, the read capacitor added to the signal interconnection M1 corresponds to the sum of (three) interelectrode capacitances (Cgs) between the gates and sources of the TFTs (T1-1 to T3-1) connected to the signal interconnection M1. The capacitor corresponds to $C_2$ shown in FIG. 1. The signal charges transferred to the signal interconnections M1 to M3 are amplified by the operational amplifiers A1 to A3. When the SMPL signal is turned on, the signal charges are transferred to the sample-and-hold capacitors CL1 to CL3 and held when the SMPL signal is turned off.

When the signals of the signal interconnections M1 to M3 are sampled and held by the sample-and-hold capacitors CL1 to CL3 in accordance with the SMPL signal of the first row, the signals of the photoelectric conversion elements S1-1 to S1-3 are output from the photoelectric conversion circuit section 10. Hence, the refresh operation of the photoelectric conversion elements S1-1 to S1-3 in the photoelectric conversion circuit section 10 and the reset operation of the signal interconnections M1 to M3 can be executed while the signals are being serially converted by the switches Sr1 to Sr3 in the read circuit section 20.

In the refresh operation of the photoelectric conversion elements S1-1 to S1-3, the switches RES11 to RES33 are turned on by the RC2 signal to apply the voltage Vg(on) to the gate interconnections of the TFTs (T1-1 to T3-1). With this operation, the G electrodes of the photoelectric conversion elements S1-1 to S1-3 are refreshed to the refresh bias V(refresh). Then, the reset operation starts.

Subsequently, in the reset operation, while the voltage Vg(on) is applied to the gate interconnections of the TFTs (T1-1 to T3-1), the switches RES11 to RES33 are turned off, and the switches RES1 to RES3 are turned on. In this way, the read capacitors of the signal interconnections M1 to M3 and the G electrodes of the photoelectric conversion elements S1-1 to S1-3 are reset to the reset bias V(reset), and in this case, the GND potential.

After the end of the reset operation, a gate pulse can be applied to the gate interconnection G2. More specifically, the signals of the first row are serially converted by the shift register SR2. During this time, in the photoelectric conversion circuit section 10, the photoelectric conversion elements S1-1 to S1-3 are simultaneously refreshed, and the signal interconnections M1 to M3 are reset so that the signal charges of the photoelectric conversion elements S2-1 to S2-3 of the second row can be transferred to the signal interconnections M1 to M3 through the shift register SR1. With the above operation, the signal charges of all the photoelectric conversion elements S1-1 to S3-3 of the first to third rows can be output.

When the above-described photoelectric conversion period and read period are repeated, continuous moving images can be acquired.

Figure 30:
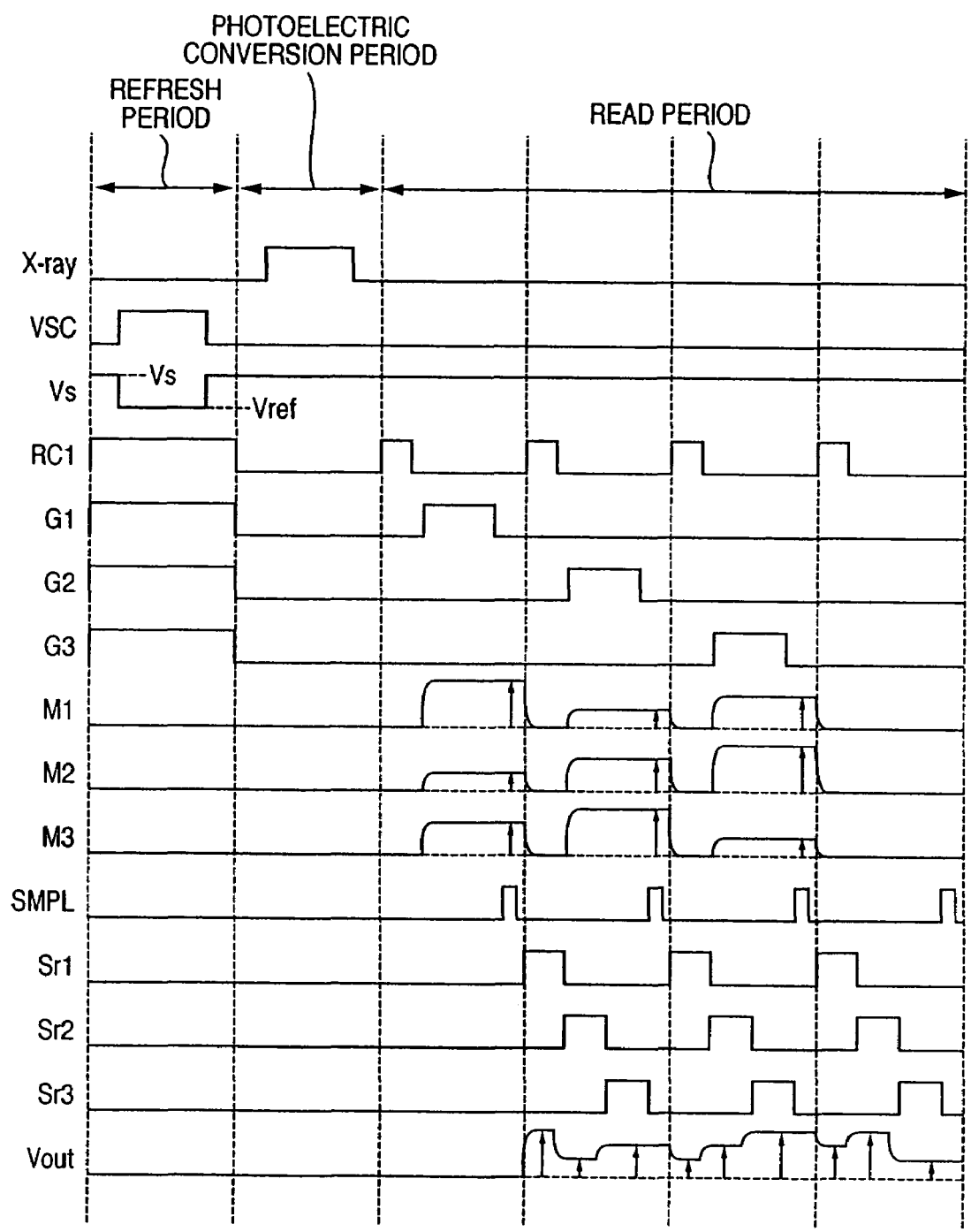
FIG. 30 is a timing chart showing the operation of the photoelectric conversion device shown in FIG. 29.

The timing chart of this embodiment is different from the timing chart of the prior art shown in FIG. 30 in that the refresh period is not present in this embodiment. When the refresh period is omitted, the frame frequency in acquiring moving images can accordingly be increased. In the prior art, all the photoelectric conversion elements are refreshed at once. Hence, the wait period to relax the variation in GND or power supply due to the dark current component in the refresh mode must be prepared. In this embodiment, however, the photoelectric conversion elements are refreshed for each row. Since the number of photoelectric conversion elements to be refreshed at once is much smaller than in the prior art, no particular wait period is necessary. Accordingly, the frame frequency can be increased.

In the above-described X-ray imaging apparatus according to this embodiment, the subject is irradiated with X-rays as pulses. However, X-ray irradiation may be done continuously (in a DC manner). This case will be described below.

Figure 5:
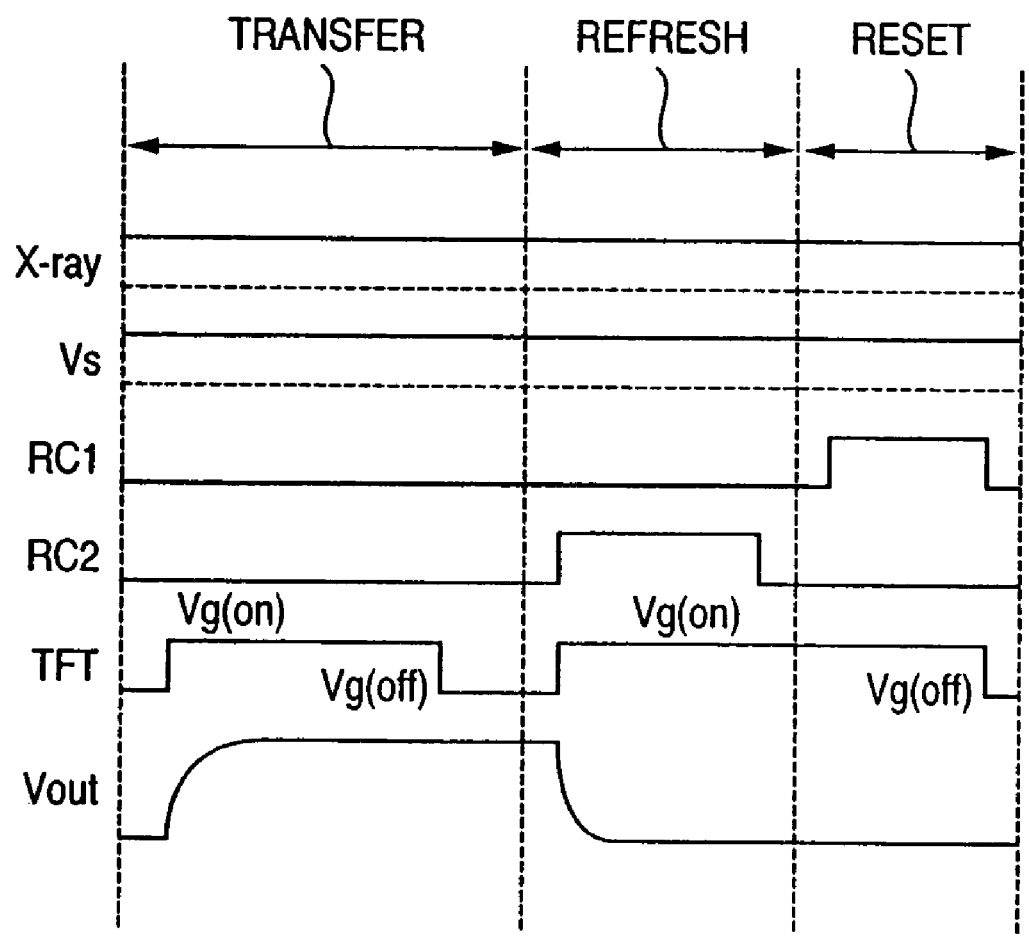
FIG. 5 is a timing chart showing an operation performed when the X-ray imaging apparatus according to the first embodiment is continuously (in a DC manner) irradiated with X-rays.

FIG. 5 is a timing chart showing an operation performed when the X-ray imaging apparatus according to the first embodiment is continuously (in a DC manner) irradiated with X-rays.

In this case, the photoelectric conversion period is a period after the end of refresh until the start of transfer. In an actual medical X-ray imaging apparatus, the photoelectric conversion circuit section is constituted by a number of pixels of N rows×M columns. For example, for the photoelectric conversion elements of the first row, the actual photoelectric conversion period equals the read period of the (N−1) rows from the second to Nth rows except the transfer, refresh, and reset periods of the photoelectric conversion elements. This also applies to the photoelectric conversion elements of the remaining rows. For them, the actual photoelectric conversion period equals the read period of the (N−1) rows except the transfer, refresh, and reset periods of the photoelectric conversion elements.

For example, for the photoelectric conversion elements of the 100th row, the actual photoelectric conversion period equals the sum of the read period from the 101st to Nth rows and the read period from the first to 99th rows in the next frame, i.e., the read period of the (N−1) rows. That is, if a subject is irradiated with X-rays in a DC manner, the photoelectric conversion period extends over two frames. However, since the photoelectric conversion period is the same, no special problem is posed.

When a subject is continuously (in a DC manner) irradiated with X-rays, the X-ray irradiation period shown in FIG. 2 or the photoelectric conversion period shown in FIG. 4 can be omitted. For this reason, the frame rate of moving images can be further increased. In addition, as compared to the pulse irradiation method, the intensity of X-rays can be reduced. Hence, the load on the tube serving as the X-ray source can be decreased. Furthermore, since the X-ray high-voltage power supply need not be pulse-controlled, the load on the X-ray power supply can be reduced.

(Second Embodiment)

Figure 6:
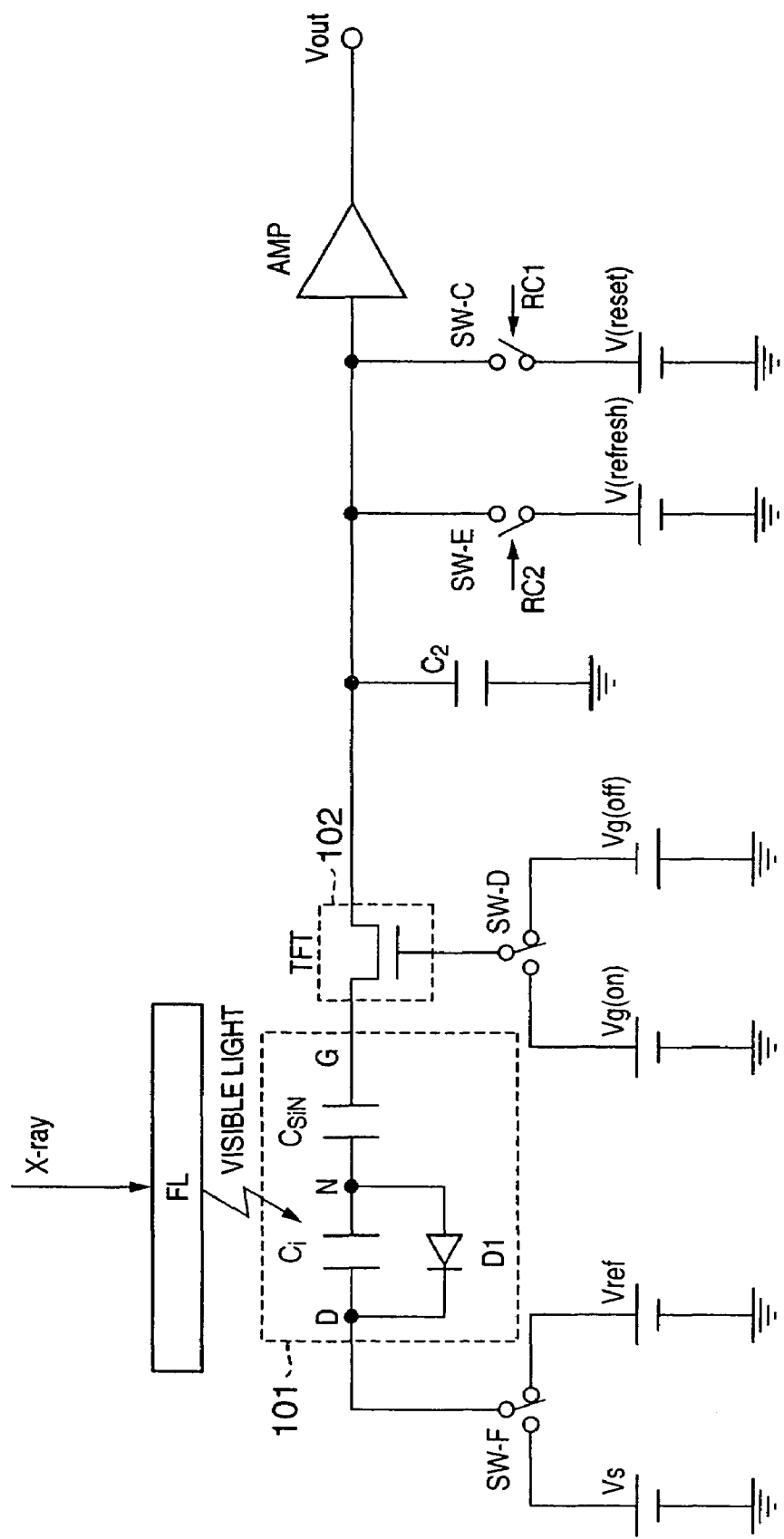
FIG. 6 is an equivalent circuit diagram of one pixel of an X-ray imaging apparatus according to the second embodiment of the present invention.

FIG. 6 is an equivalent circuit diagram of one pixel of an X-ray imaging apparatus according to the second embodiment of the present invention. In the equivalent circuit diagram of the first embodiment shown in FIG. 1, the D electrode of the photoelectric conversion element 101 is biased by the predetermined voltage Vs. In the second embodiment, however, a voltage Vs and voltage Vref can be switched by a switch SW-F.

As a characteristic feature of this embodiment, the voltage from the G electrode side or that from the D electrode side can be selected as an application voltage to execute the refresh operation of a photoelectric conversion element 101. For example, to acquire one still image, a refresh bias is applied from the D electrode side. That is, an operation based on the timing chart shown in FIG. 28 is executed. On the other hand, to acquire a plurality of still images, a refresh bias is applied from the G electrode side. That is, an operation based on the timing chart shown in FIG. 2 is executed. In this embodiment, both the conventional mode for obtaining a still image (imaging mode or still image mode) and the mode for acquiring a moving image (fluoroscopy mode or moving image mode) can be executed by a single X-ray imaging apparatus.

Figure 7:
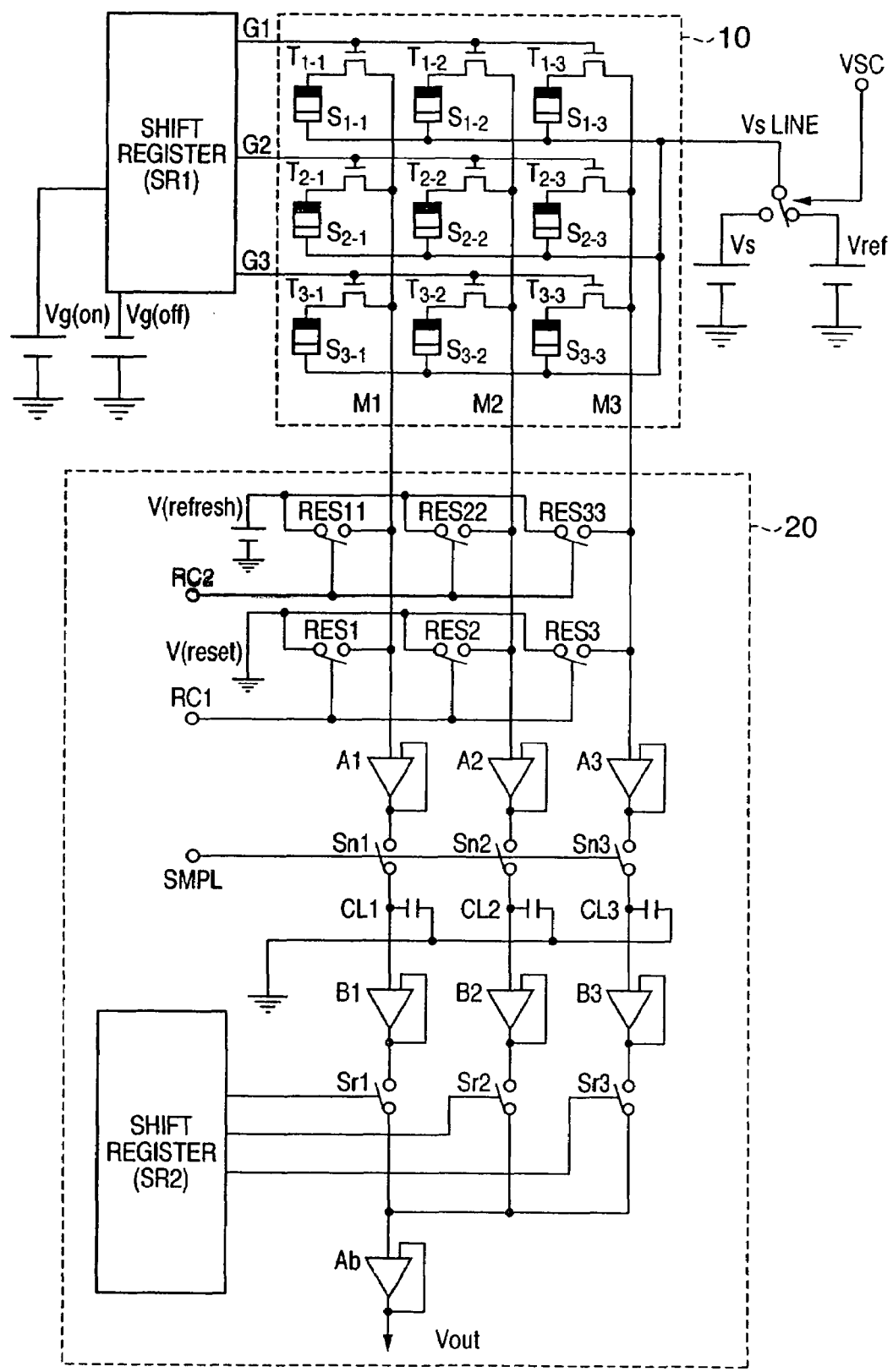
FIG. 7 is an equivalent circuit diagram of the X-ray imaging apparatus according to the second embodiment.

FIG. 7 is an equivalent circuit diagram of the X-ray imaging apparatus according to the second embodiment.

The equivalent circuit diagram shown in FIG. 7 is different from FIG. 3 in that the bias line of the sensor can be switched between the voltage Vs and the voltage Vref by a control signal VSC.

Figure 8:
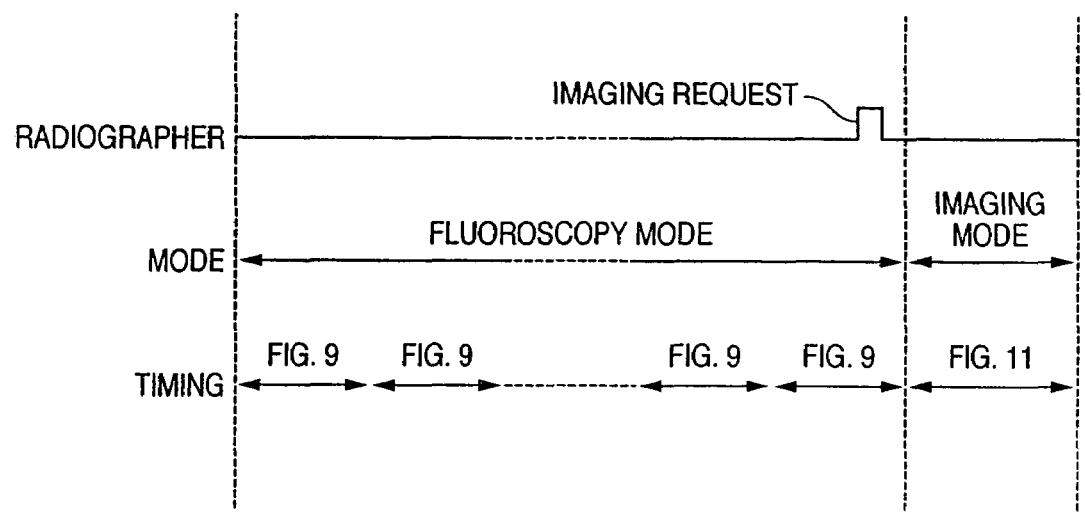
FIG. 8 is a timing chart showing an operation performed when a fluoroscopy mode (moving image mode) of the X-ray imaging apparatus according to the second embodiment is changed to an imaging mode (still image mode) to execute imaging.

FIG. 8 is a timing chart showing an operation performed when the fluoroscopy mode (moving image mode) of the X-ray imaging apparatus according to the second embodiment is changed to the imaging mode (still image mode) to execute imaging.

Figure 9:
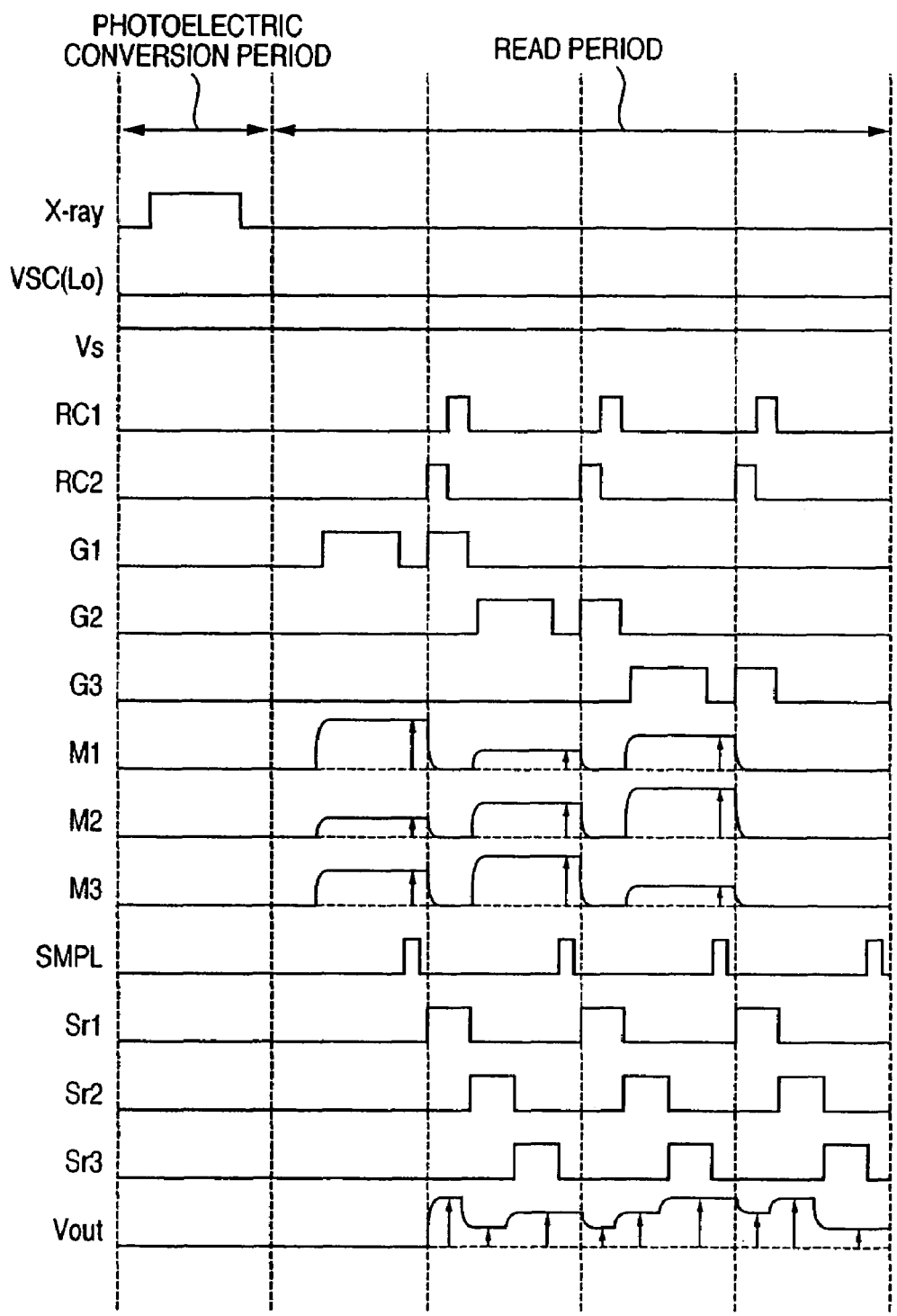
FIG. 9 is a timing chart of the fluoroscopy mode in FIG. 8.
Figure 11:
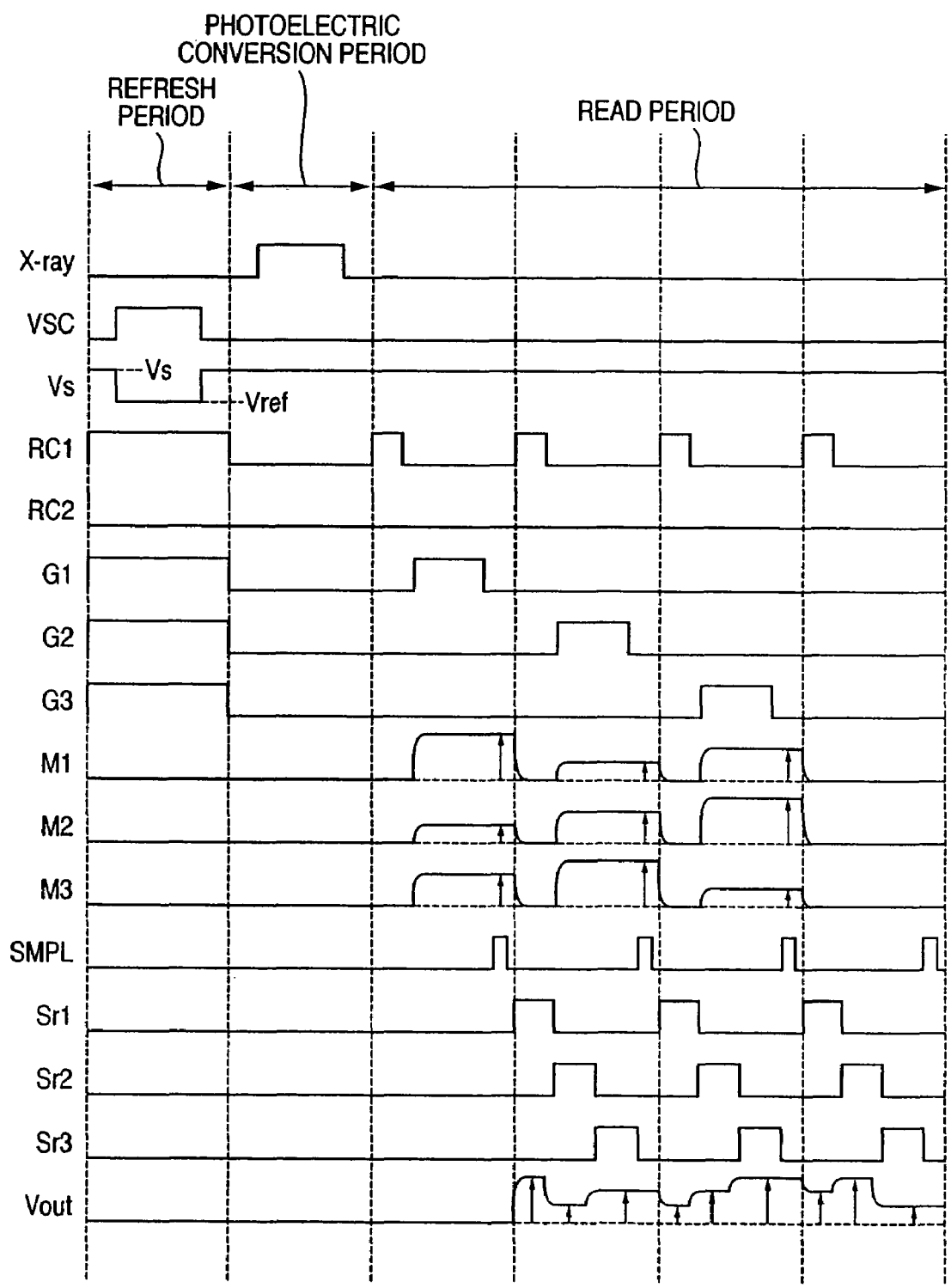
FIG. 11 is a timing chart of the imaging mode in FIG. 8.

FIG. 9 is a timing chart showing the operation in the fluoroscopy mode of the X-ray imaging apparatus shown in FIG. 7. That is, in the fluoroscopy mode, the timing operation shown in FIG. 8 is repeated. During this period, the radiographer monitors the fluoroscopic image of the object (patient) to decide the position or angle of the patient in obtaining a still image. Generally, the intensity of X-ray irradiation during this period is relatively low. When the radiographer inputs an irradiation request signal (a decision signal for obtaining a still image) to the apparatus, the fluoroscopy mode changes to the imaging mode. FIG. 11 shows the operation timing in the imaging mode. In the flow of the fluoroscopy mode and imaging mode, the number of times of imaging mode is not limited to one, as shown in FIG. 8. The modes may be repeated as fluoroscopy mode→ imaging mode→ fluoroscopy mode→ imaging mode . . . in accordance with the imaging composition of the object.

Figure 10:
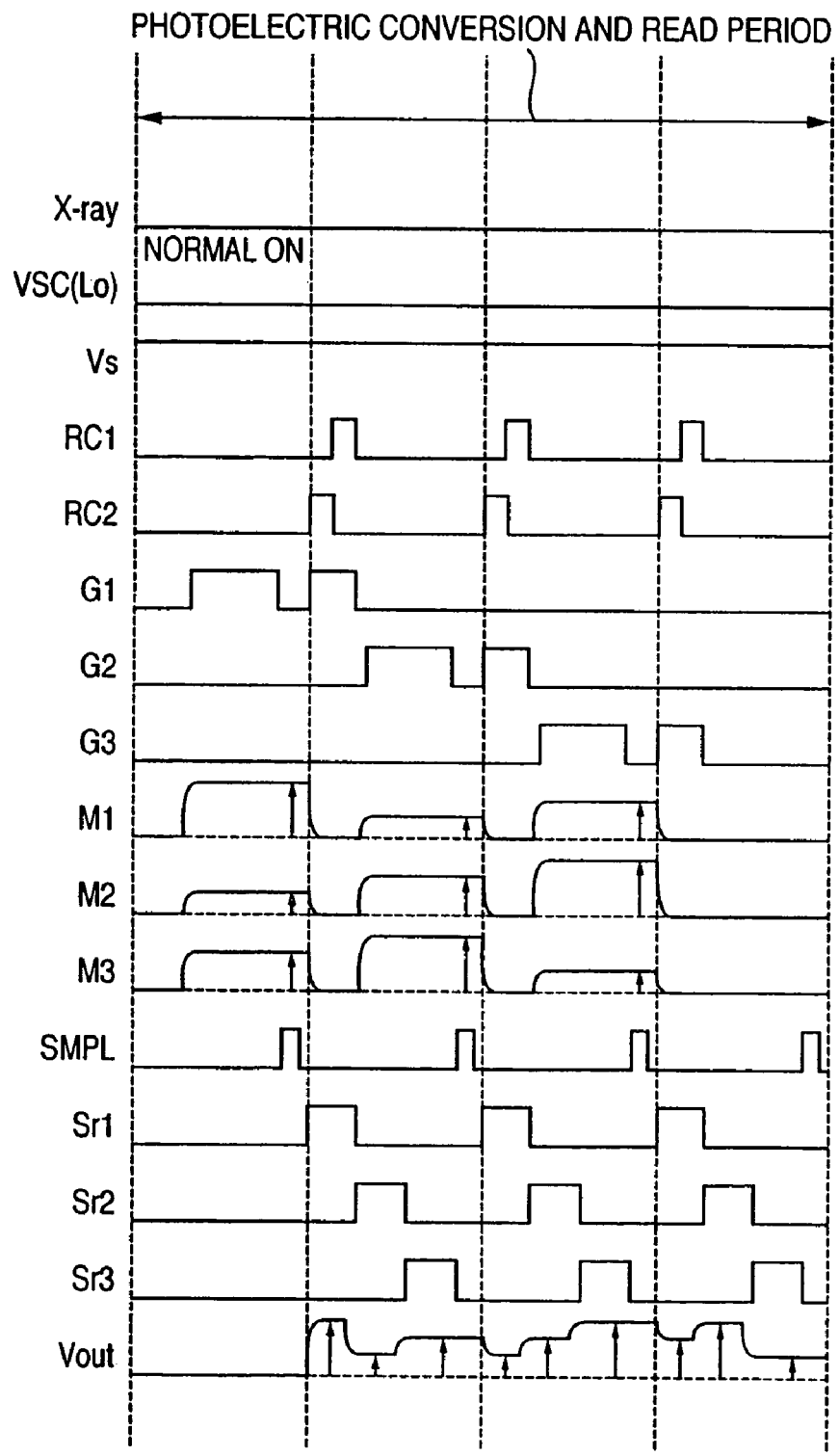
FIG. 10 is another timing chart of the fluoroscopy mode in FIG. 8.

FIG. 10 is another timing chart in the fluoroscopy mode shown in FIG. 8, which is different from FIG. 9. The difference from FIG. 9 is that the subject is not irradiated with X-rays as pulses. Since the read and photoelectric conversion can be executed in the same period, the operation frequency in the fluoroscopy mode can be increased. In addition, since no X-rays as pulses are used, the load on the X-ray generation source can be reduced.

When the X-ray imaging apparatus of the present invention is applied to a fluoroscopic apparatus, continuous images are acquired in the fluoroscopy mode while executing refresh from the switch side of a read circuit section 20 through TFTs. When positioning is ended by fluoroscopy, and the fluoroscopy mode is changed to the still image mode, refresh can be executed from the switch SW-F to obtain a still image having a high S/N ratio. That is, generally, the efficiency is higher and the S/N ratio is also higher in refresh from the switch SW-F side than in refresh from the TFT side. It is reasonable that in obtaining a fluoroscopic positioning image that allows a relatively low S/N ratio, refresh from the side of the switch of the read circuit section 20 is employed. On the other hand, in obtaining a still image that requires a high S/N ratio and high image quality, refresh from the switch SW-F side is employed.

(Third Embodiment)

Figure 12:
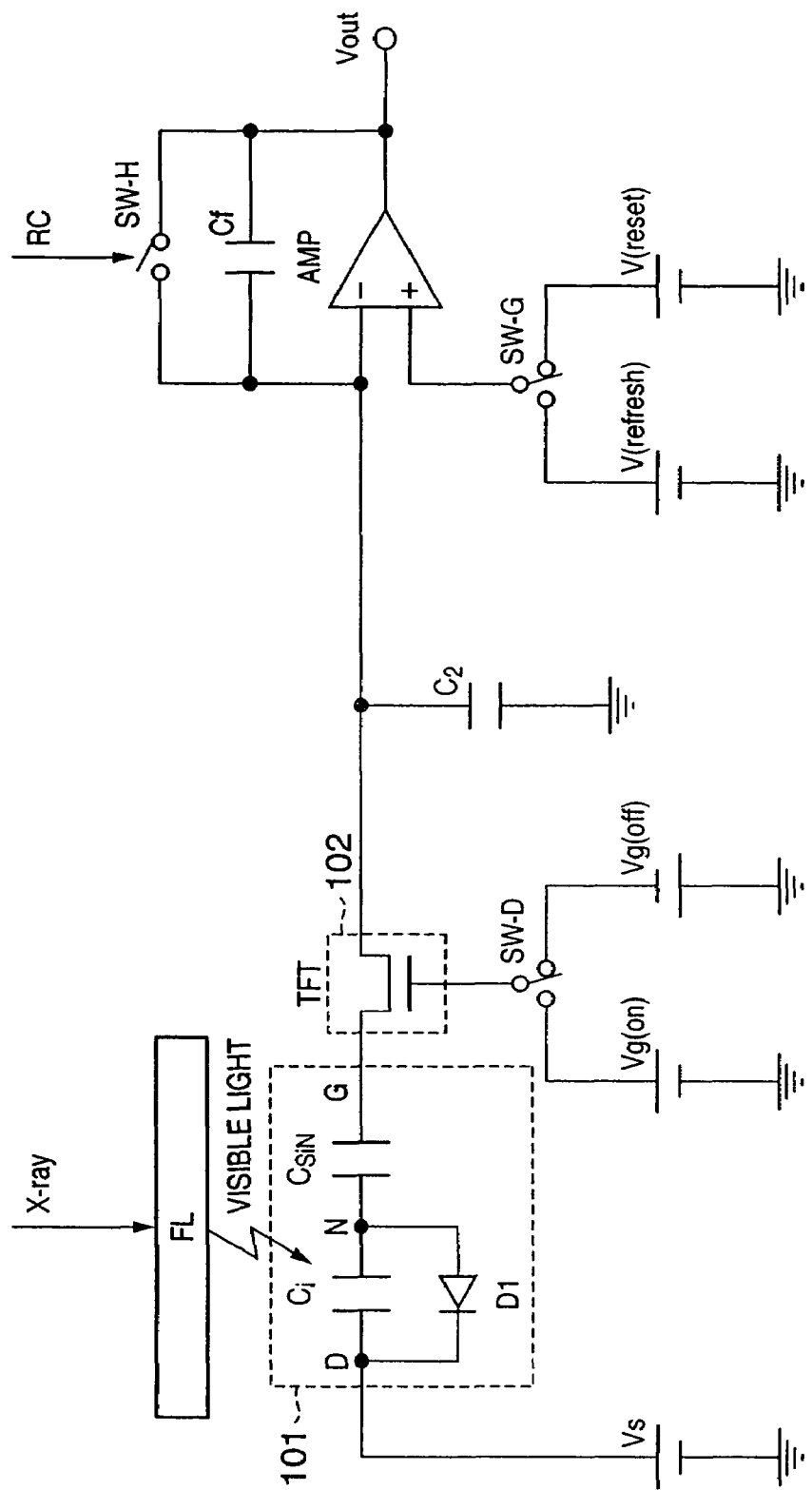
FIG. 12 is an equivalent circuit diagram of one pixel of an X-ray imaging apparatus according to the third embodiment of the present invention.

FIG. 12 is an equivalent circuit diagram of one pixel of an X-ray imaging apparatus according to the third embodiment. The same reference numerals or symbols as in the X-ray imaging apparatus shown in FIG. 1 denote the same component in FIG. 12. Different constituent elements will mainly be described below.

A switch SW-G shown in FIG. 12 is selectively switched to apply one of a reset bias V(reset) and refresh bias V(refresh) to the noninverting terminal (+) of the operational amplifier (AMP). A capacitive element Cf stores (integrates) a signal current from a photoelectric conversion element 101 through a TFT 102 and is connected between the inverting terminal and an output terminal Vout of the operational amplifier. A switch SW-H is connected in parallel to the capacitive element Cf to reset the integrated signal charges or refresh the photoelectric conversion element 101 through the TFT 102. The switch SW-H is controlled by an RC signal.

A power supply Vg(on) turns on the TFT 102 to transfer signal charges to the capacitive element Cf. A power supply Vg(off) turns off the TFT 102. A switch SW-D switches between the power supply Vg(on) and the power supply Vg(off).

To refresh the photoelectric conversion element 101, the switch SW-G must be set on the reset bias V(reset) side to turn on a switch SW-E. Simultaneously, the switch SW-D must be set on the power supply Vg(on) side.

Figure 13:
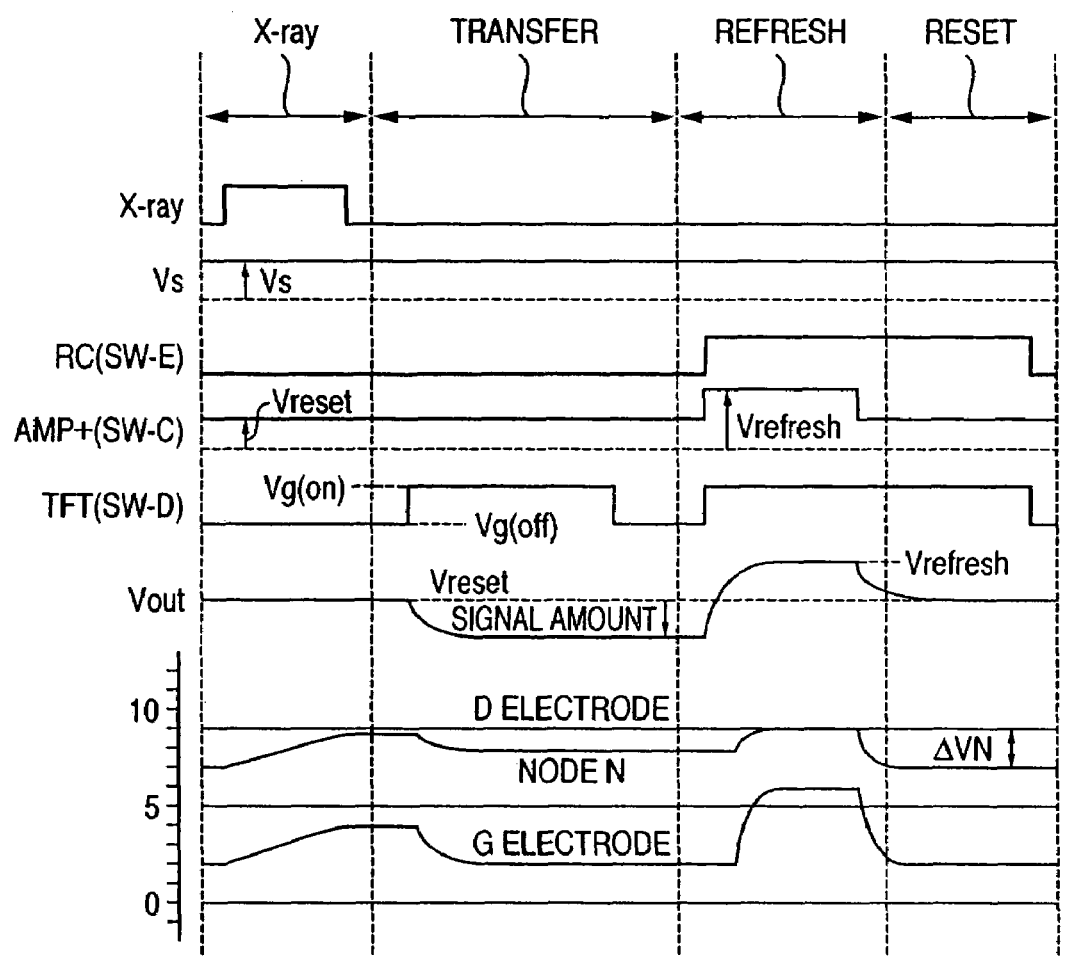
FIG. 13 is a timing chart showing the circuit operation of one pixel of the X-ray imaging apparatus shown in FIG. 12.

FIG. 13 is a timing chart showing the circuit operation of one pixel of the X-ray imaging apparatus shown in FIG. 12.

The circuit operation of one pixel having the photoelectric conversion element 101 and TFT 102 will be described with reference to FIGS. 12 and 13.

The operation during the X-ray irradiation period is the same as in the above-described first embodiment, and a description thereof will be omitted. During the X-ray irradiation period, the switch SW-D is set on the V(off) side, the switch SW-G is set on the V(reset) side, and the switch SW-H is turned off.

A transfer period will be described next.

In the transfer operation, the switch SW-D is set on the Vg(on) side to turn on the TFT 102. With this operation, electron carriers (Se) corresponding to the number (Sh) of hole carriers stored upon X-ray irradiation flow from a $C_2$ side to the G electrode side through the TFT 102. Accordingly, the charges are stored in a capacitive element Cf. The potential on the output terminal side of the operational amplifier changes (drops) by an amount equal to the signal amount. At this time, Se and Sh hold $Se = Sh \times C_{SiN}/(C_{SiN} + C_i)$. The potential of the read capacitor $C_2$ is virtually grounded by the bias V(reset) at the noninverting terminal (+) of the operational amplifier and therefore does not change.

A refresh operation will be described next.

The timing chart of FIG. 13 shows the potentials of the D electrode, G electrode, and node N when Vs=9 (V), Vg(reset)=2 (V), and V(refresh)=6 (V) and the capacitance component $C_i$ equals the capacitance component $C_{SiN}$ in the equivalent circuit diagram shown in FIG. 12.

In the refresh operation, the switch SW-H is turned on by the RC signal. The switch SW-D is set on the Vg(on) side. The switch SW-G is set on the V(refresh) side. With this operation, the potential of the G electrode of the photoelectric conversion element 101 rises from the potential (V(reset)=2 (V)) at signal transfer to the refresh bias V(refresh)=6 V. Simultaneously, the potential of the node N also rises but does not exceed Vs=9 V. When the potential of the node N increases, some of the signal charges (hole carriers) stored in the node N are discharged to the D electrode side, so the refresh operation of the photoelectric conversion element 101 is executed.

A reset operation will be described next.

In the reset operation, the switch SW-D is kept on the Vg(on) side, and the switch SW-H is kept ON. In this state, the switch SW-G is changed from the V(refresh) side to the V(reset) side. With this operation, the G electrode of the photoelectric conversion element 101 is reset to the reset bias V(reset). Simultaneously, the capacitive element Cf connected to the output terminal of the operational amplifier is reset to the reset bias V(reset). That is, in the reset operation in which the potential difference between the two terminals of the capacitive element Cf becomes zero, the potential of the node N attenuates from the potential (9 V in FIG. 13) in the refresh operation. The attenuation amount $\Delta$VN is ½ of the potential difference between V(refresh) and V(reset) when the capacitance component $C_i$ equals the capacitance component $C_{SiN}$. In this description, the decrease amount is 2 V. In addition, the attenuation amount $\Delta$VN of the node N decides the amount of hole carriers stored in the next photoelectric conversion operation.

In FIG. 28 that shows the prior art, the wait period is prepared. However, no wait period is prepared in the timing chart shown in FIG. 13. The reason will be described below with reference to FIGS. 14 and 15.

Figure 14:
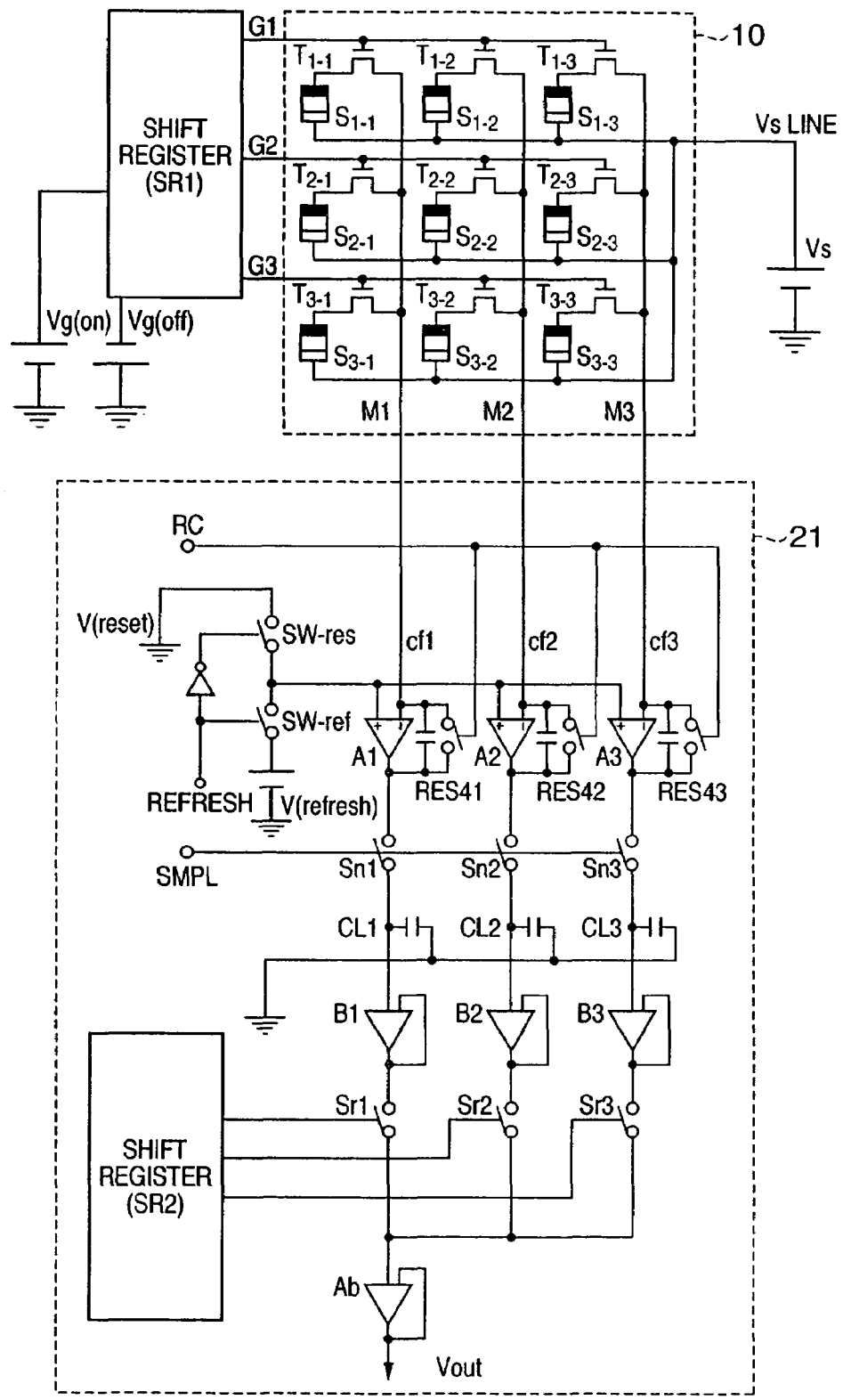
FIG. 14 is an equivalent circuit diagram of the X-ray imaging apparatus according to the third embodiment.

FIG. 14 is an equivalent circuit diagram of the X-ray imaging apparatus according to the third embodiment. For the descriptive convenience, FIG. 14 illustrates only 3×3=9 pixels which are two-dimensionally arrayed in a photoelectric conversion circuit section 10.

A read circuit section 21 reads the parallel signal outputs from the photoelectric conversion circuit section 10, converts the outputs into serial signals, and outputs them. Reference symbols A1 to A3 denote operational amplifiers connected to signal interconnections M1 to M3 and inverting terminals (−). Capacitive elements Cf1 to Cf3 are connected between the inverting terminals (−) and the output terminals. The capacitive elements Cf1 to Cf3 integrate the currents based on the output signals from the photoelectric conversion elements 101 when the TFTs 102 are turned on and convert the currents into voltage amounts. Switches RES41 to RES43 reset the capacitive elements Cf1 to Cf3 to the reset bias V(reset). The switches RES41 to RES43 are connected in parallel to the capacitive elements Cf1 to Cf3.

A switch SW-res resets the noninverting terminals of the operational amplifiers A1 to A3 to the reset bias V(reset) (0 V in FIG. 14). A switch SW-ref refreshes the noninverting terminals of the operational amplifiers A1 to A3 to the refresh bias V(refresh). These switches are controlled by a "REFRESH" signal. When the "REFRESH" signal is "Hi", the switch SW-ref is turned on. When the "REFRESH" signal is "Lo", the switch SW-res is turned on. These switches are not simultaneously turned on.

Figure 15:
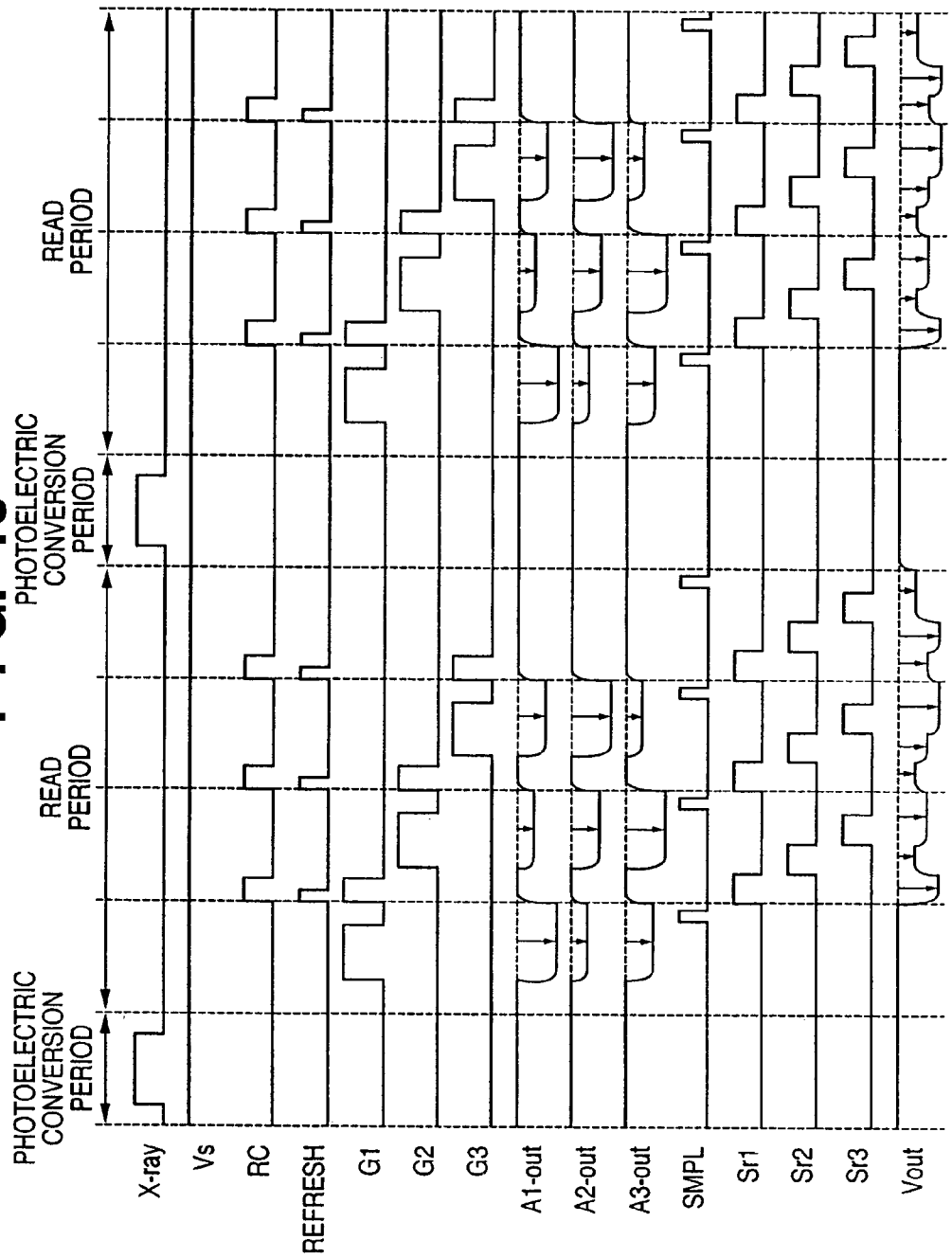
FIG. 15 is a timing chart showing the operation of the X-ray imaging apparatus shown in FIG. 14.

FIG. 15 is a timing chart showing the operation of the X-ray imaging apparatus shown in FIG. 14. FIG. 15 shows the operation of two frames. The operation of the photoelectric conversion device shown in FIG. 14 will be described with reference to this timing chart.

A photoelectric conversion period will be described first.

The D electrodes of all photoelectric conversion elements S1-1 to S3-3 are biased to a read power supply Vs (positive potential). All signals in a shift register SR1 are "Lo". All TFTs (T1-1 to T3-3) for switching are OFF. When the light source is turned on in this state to emit a pulse, the D electrodes (N+ electrodes) of the photoelectric conversion elements S1-1 to S3-3 are irradiated with light. Electron and hole carriers are generated in the i-layers of the photoelectric conversion elements S1-1 to S3-3. The electrons are moved to the D electrodes by the read power supply Vs. Holes are stored in the interface between the i-layer and the insulating layer of each of the photoelectric conversion elements S1-1 to S3-3. The holes are held even after the X-rays are turned off.

A read period will be described next.

A read operation is performed in the order of the photoelectric conversion elements S1-1 to S1-3 of the first row, the photoelectric conversion elements S2-1 to S2-3 of the second row, and the photoelectric conversion elements S3-1 to S3-3 of the third row.

First, to read the photoelectric conversion elements S1-1 to S1-3 of the first row, a gate pulse is applied from the shift register SR1 to a gate interconnection G1 of the switch elements (TFTs) T1-1 to T1-3. At this time, the high level of the gate pulse equals the externally supplied voltage Vg(on). Accordingly, the TFTs (T1-1 to T1-3) are turned on. Signal charges stored in the photoelectric conversion elements S1-1 to S1-3 flow as currents through the TFTs (T1-1 to T1-3). The currents flow into the capacitive elements Cf1 to Cf3 connected to the operational amplifiers A1 to A3 and are integrated.

Although not particularly illustrated in FIG. 14, a read capacitor is added to each of the signal interconnections M1 to M3. The signal charges are transferred to the read capacitors through the TFTs (T1-1 to T1-3). However, the signal interconnections M1 to M3 are virtually grounded by the reset bias (GND) at the noninverting terminals of the operational amplifiers A1 to A3. Hence, the potentials are not changed by the transfer operation and held at GND. That is, the above-described signal charges are transferred to the capacitive elements Cf1 to Cf3.

The output terminals of the operational amplifiers A1 to A3 change as shown in FIG. 4 in accordance with the signal amounts of the photoelectric conversion elements S1-1 to S1-3. Since the TFTs (T1-1 to T3-1) are simultaneously turned on, the outputs from the operational amplifiers A1 to A3 simultaneously change. That is, parallel outputs are obtained. In this state, the "SMPL" signal is turned on. The output signals from the operational amplifiers A1 to A3 are transferred to sample-and-hold capacitors CL1 to CL3. When the "SMPL" signal is turned off, the signals are temporarily held.

When a pulse is applied from the shift register SR2 to switches Sr1, Sr2, and Sr3 in this order, the signals held by the sample-and-hold capacitors CL1 to CL3 are output from a buffer amplifier Ab in the order of the sample-and-hold capacitors CL1, CL2, and CL3. As a result, photoelectric conversion signals of one row including the photoelectric conversion elements S1-1, S1-2, and S1-3 are sequentially converted into serial signals and output. The read operation of the photoelectric conversion elements S2-1 to S2-3 of the second row and the read operation of the photoelectric conversion elements S3-1 to S3-3 of the third row are executed in the same way as described above.

When the signals of the operational amplifiers A1 to A3 are sampled and held by the sample-and-hold capacitors CL1 to CL3 in accordance with the SMPL signal of the first row, the signals of the photoelectric conversion elements S1-1 to S1-3 are output from the photoelectric conversion circuit section 10. Hence, the refresh operation of the photoelectric conversion elements S1-1 to S1-3 in the photoelectric conversion circuit section 10 and the reset operation of the capacitive elements Cf1 to Cf3 can be executed while the signals are being serially converted by the switches Sr1 to Sr3 in the read circuit section 21.

The refresh operation of the photoelectric conversion elements S1-1 to S1-3 is attained by changing the "REFRESH" signal to "Hi" to turn on the switch SW-ref, turning on the switches RES41 to RES43 by the "RC" signal, and applying the voltage Vg(on) to the gate interconnections of the TFTs (T1-1 to T3-1). That is, the G electrodes of the photoelectric conversion elements S1-1 to S1-3 are refreshed to the refresh bias V(refresh). Then, the reset operation starts.

Subsequently, in the reset operation, while the voltage Vg(on) is applied to the gate interconnections of the TFTs (T1-1 to T3-1), and the switches RES41 to RES43 are kept ON, the "REFRESH" signal is set to "Lo". With this operation, the G electrodes of the photoelectric conversion elements S1-1 to S1-3 are reset to the reset bias V(reset)= GND. Simultaneously, the signals stored in the capacitive elements Cf1 to Cf3 are reset.

After the end of the reset operation, a gate pulse can be applied to the gate interconnection G2. More specifically, the signals of the first row are serially converted by the shift register SR2. During this time, the photoelectric conversion elements S1-1 to S1-3 are simultaneously refreshed, the capacitive elements Cf1 to Cf3 are reset, and the signal charges of the photoelectric conversion elements S2-1 to S2-3 of the second row can be transferred to the signal interconnections M1 to M3 through the shift register SR1. With the above operation, the signal charges of all the photoelectric conversion elements S1-1 to S3-3 of the first to third rows can be output.

When the above-described photoelectric conversion period and read period are repeated, continuous moving images can be acquired.

The timing chart of this embodiment is different from the timing chart of the prior art shown in FIG. 30 in that the refresh period is not present in this embodiment. When the refresh period is omitted, the frame frequency in acquiring moving images can accordingly be increased. In the prior art, all the photoelectric conversion elements are refreshed at once. Hence, the wait period to relax the variation in GND or power supply due to the dark current component in the refresh mode must be prepared. In this embodiment, however, the photoelectric conversion elements are refreshed for each row. Since the number of photoelectric conversion elements to be refreshed at once is much smaller than in the prior art, no particular wait period is necessary. Accordingly, the frame frequency can be increased.

In the above-described X-ray imaging apparatus according to this embodiment, the subject is irradiated with X-rays as pulses. However, X-ray irradiation may be done continuously (in a DC manner). This case will be described below.

Figure 16:
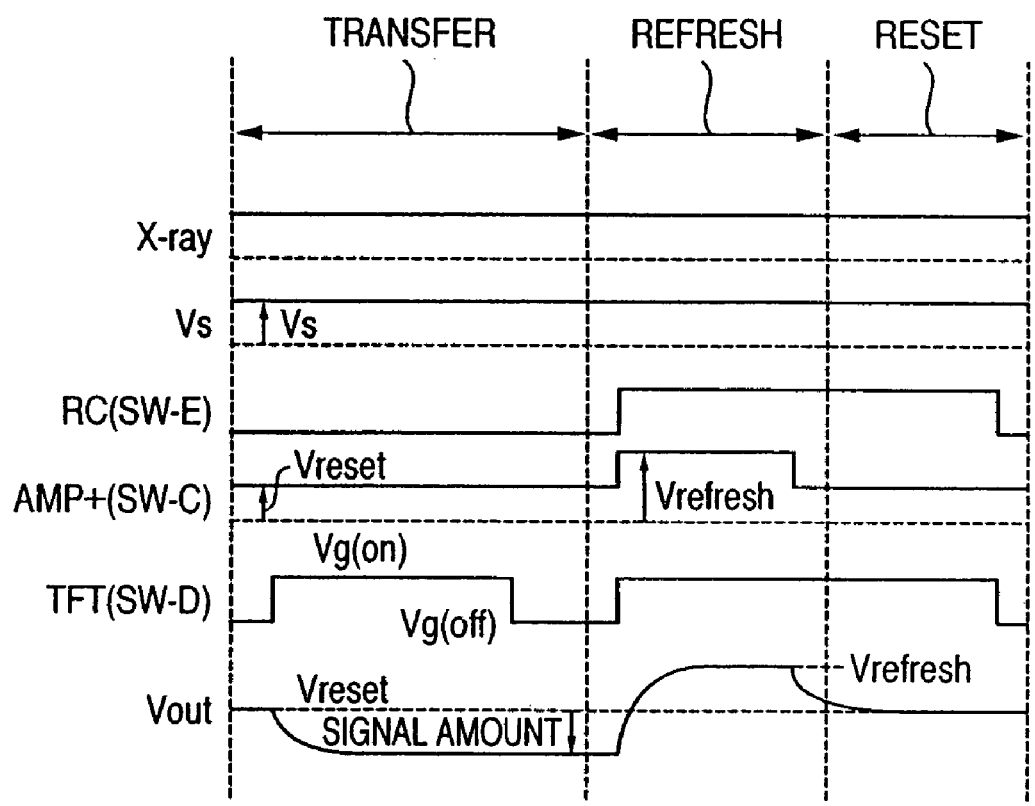
FIG. 16 is a timing chart showing an operation performed when the X-ray imaging apparatus according to the third embodiment is continuously (in a DC manner) irradiated with X-rays.

FIG. 16 is a timing chart showing an operation performed when the X-ray imaging apparatus according to the third embodiment is continuously (in a DC manner) irradiated with X-rays.

In this case, the photoelectric conversion period is a period after the end of refresh until the start of transfer. In an actual medical X-ray imaging apparatus, the photoelectric conversion circuit section is constituted by a number of pixels of N rows×M columns. For example, for the photoelectric conversion elements of the first row, the actual photoelectric conversion period equals the read period of the (N-1) rows from the second to Nth rows except the transfer, refresh, and reset periods of the photoelectric conversion elements. This also applies to the photoelectric conversion elements of the remaining rows. For them, the actual photoelectric conversion period equals the read period of the (N-1) rows except the transfer, refresh, and reset periods of the photoelectric conversion elements.

For example, for the photoelectric conversion elements of the 100th row, the actual photoelectric conversion period equals the sum of the read period from the 101st to Nth rows and the read period from the first to 99th rows in the next frame, i.e., the read period of the (N-1) rows. That is, if a subject is irradiated with X-rays in a DC manner, the photoelectric conversion period extends over two frames. However, since the photoelectric conversion period is the same, no special problem is posed.

When a subject is continuously (in a DC manner) irradiated with X-rays, the X-ray irradiation period shown in FIG. 2 or the photoelectric conversion period shown in FIG. 4 can be omitted. For this reason, the frame rate of moving images can be further increased. In addition, as compared to the pulse irradiation method, the intensity of X-rays can be reduced. Hence, the load on the tube serving as the X-ray source can be decreased. Furthermore, since the X-ray high-voltage power supply need not be pulse-controlled, the load on the X-ray power supply can be reduced.

(Fourth Embodiment)

Figure 17:
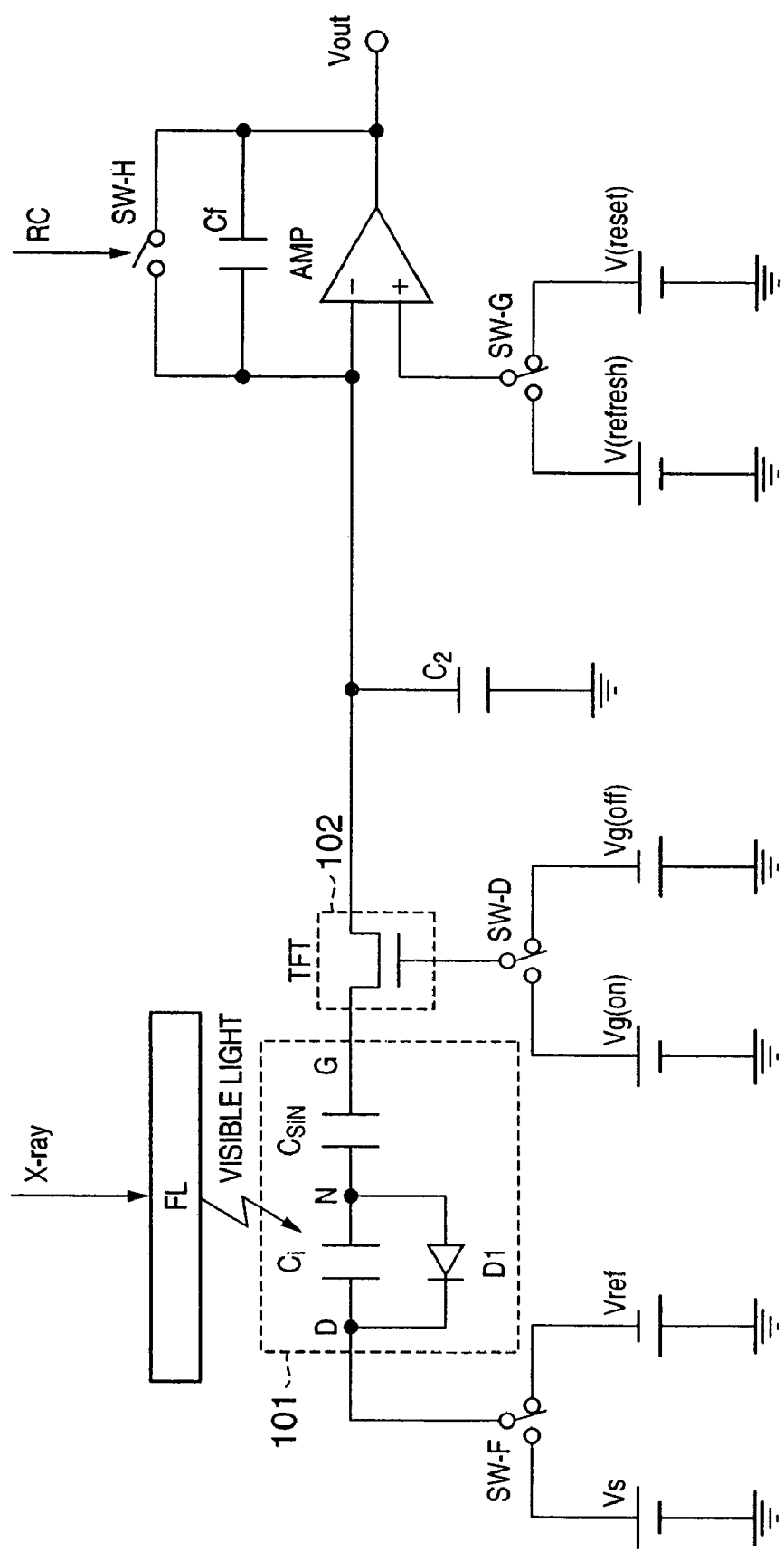
FIG. 17 is an equivalent circuit diagram of one pixel of an X-ray imaging apparatus according to the fourth embodiment of the present invention.

FIG. 17 is an equivalent circuit diagram of one pixel of an X-ray imaging apparatus according to the fourth embodiment of the present invention. In the equivalent circuit diagram of the third embodiment shown in FIG. 12, the D electrode of the photoelectric conversion element 101 is biased by the predetermined voltage Vs. In the fourth embodiment, however, a voltage Vs and voltage Vref can be switched by a switch SW-F.

As a characteristic feature of this embodiment, the voltage from the G electrode side or that from the D electrode side can be selected as an application voltage to execute the refresh operation of a photoelectric conversion element 101. For example, to acquire one still image, a refresh bias is applied from the D electrode side. That is, an operation based on the timing chart shown in FIG. 28 is executed. On the other hand, to acquire a plurality of still images, a refresh bias is applied from the G electrode side. That is, an operation based on the timing chart shown in FIG. 13 or 16 is executed. In this embodiment, both the conventional mode for obtaining a still image (imaging mode or still image mode) and the mode for acquiring a moving image (fluoroscopy mode or moving image mode) can be executed by a single X-ray imaging apparatus.

Figure 18:
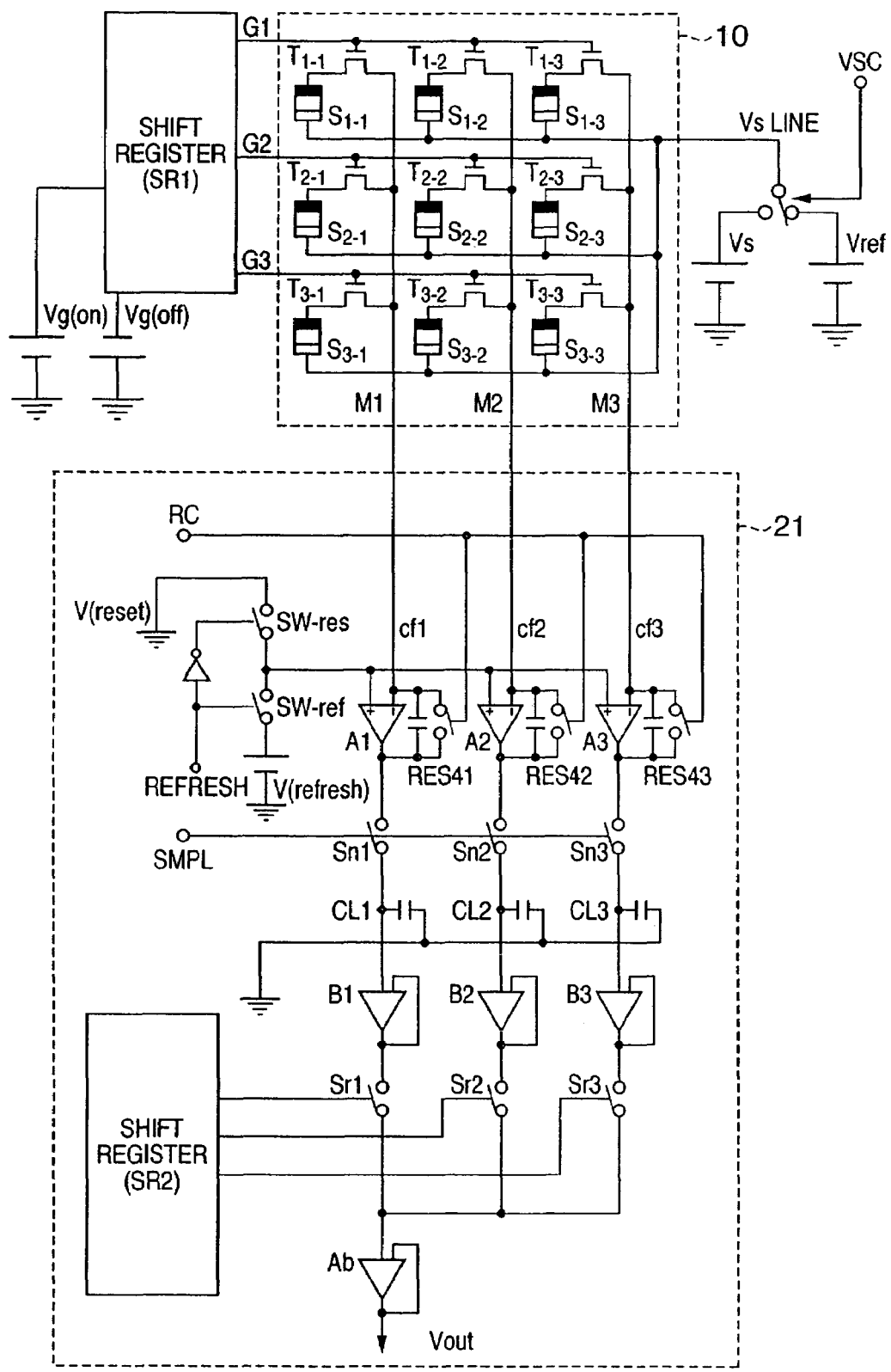
FIG. 18 is an equivalent circuit diagram of the X-ray imaging apparatus according to the fourth embodiment.

FIG. 18 is an equivalent circuit diagram of the X-ray imaging apparatus according to the fourth embodiment.

The equivalent circuit diagram shown in FIG. 18 is different from. FIG. 14 in that the bias line of the sensor can be switched between the voltage Vs and the voltage Vref by a control signal VSC.

Figure 19:
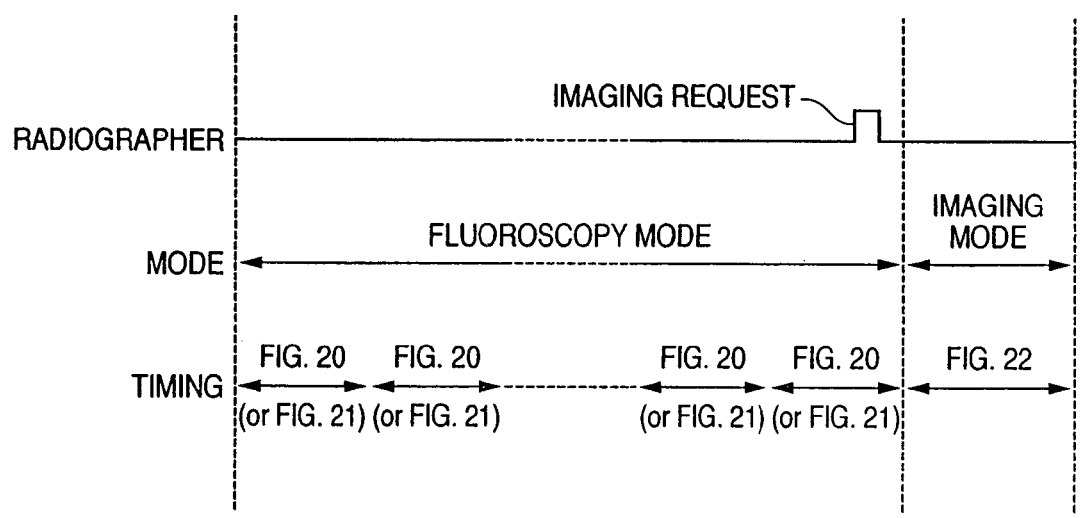
FIG. 19 is a timing chart showing an operation performed when a fluoroscopy mode (moving image mode) of the X-ray imaging apparatus according to the fourth embodiment is changed to an imaging mode (still image mode) to execute imaging.

FIG. 19 is a timing chart showing an operation performed when the fluoroscopy mode (moving image mode) of the X-ray imaging apparatus according to the fourth embodiment is changed to the imaging mode (still image mode) to execute imaging.

Figure 20:
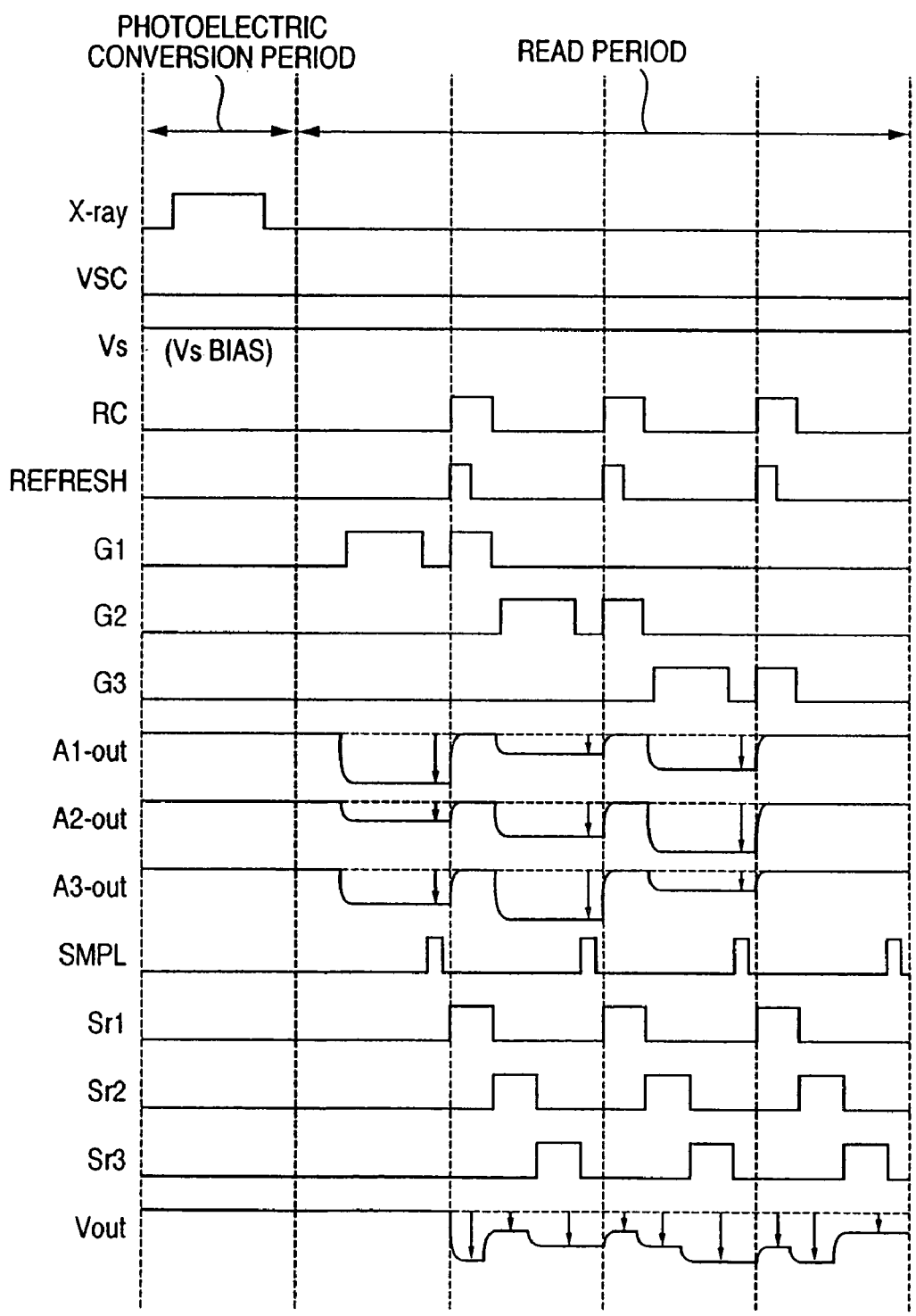
FIG. 20 is a timing chart of the fluoroscopy mode in FIG. 19.
Figure 22:
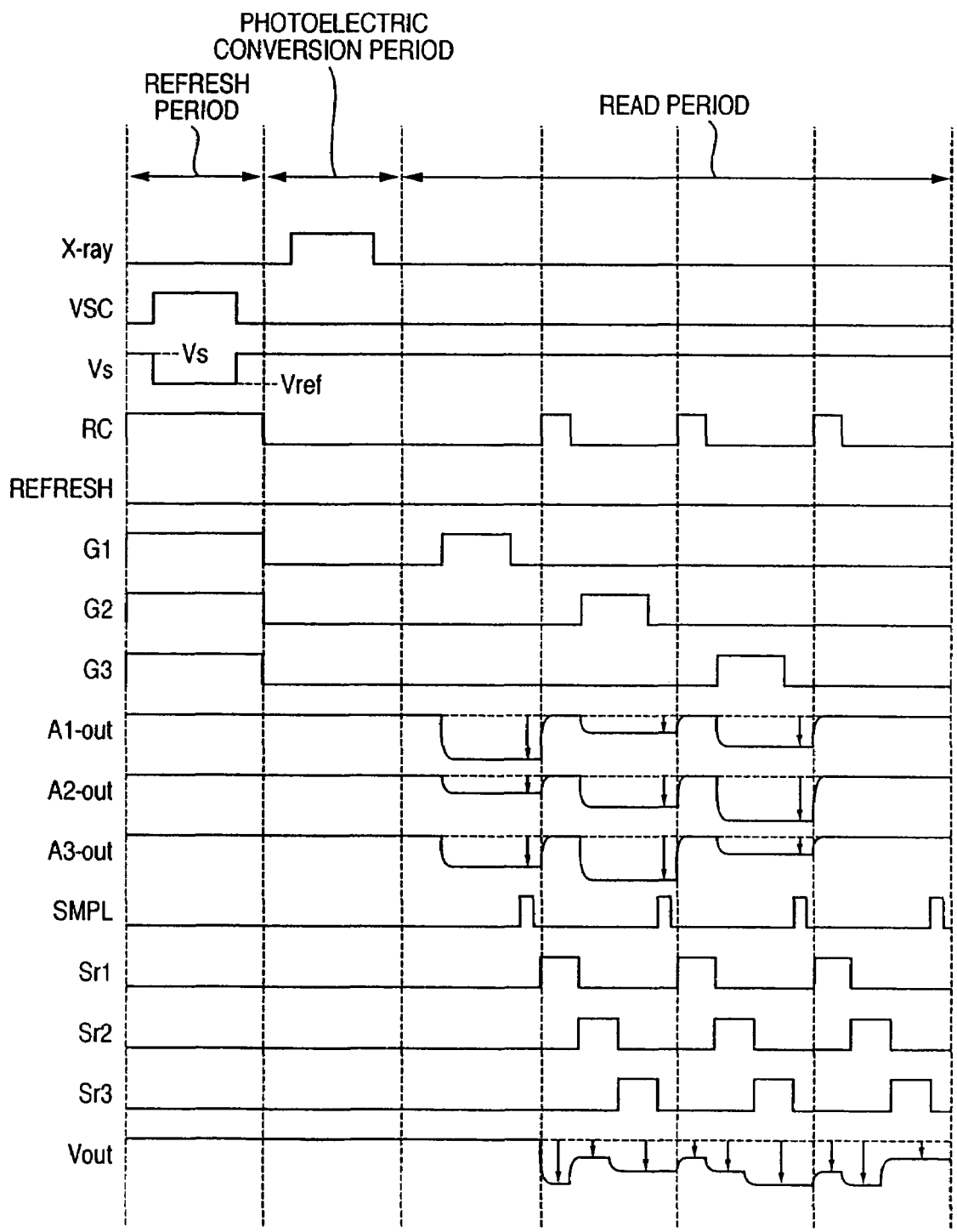
FIG. 22 is a timing chart of the imaging mode in FIG. 19.

FIG. 20 is a timing chart showing the operation in the fluoroscopy mode of the X-ray imaging apparatus shown in FIG. 18. That is, in the fluoroscopy mode, the timing operation shown in FIG. 19 is repeated. During this period, the radiographer monitors the fluoroscopic image of the object (patient) to decide the position or angle of the patient in obtaining a still image. Generally, the intensity of X-ray irradiation during this period is relatively low. When the radiographer inputs an irradiation request signal (a decision signal for obtaining a still image) to the apparatus, the fluoroscopy mode changes to the imaging mode. FIG. 22 shows the operation timing in the imaging mode. In the flow of the fluoroscopy mode and imaging mode, the number of times of imaging mode is not limited to one, as shown in FIG. 19. The modes may be repeated as fluoroscopy mode→ imaging mode→ fluoroscopy mode→ imaging mode . . . in accordance with the imaging composition of the object.

Figure 21:
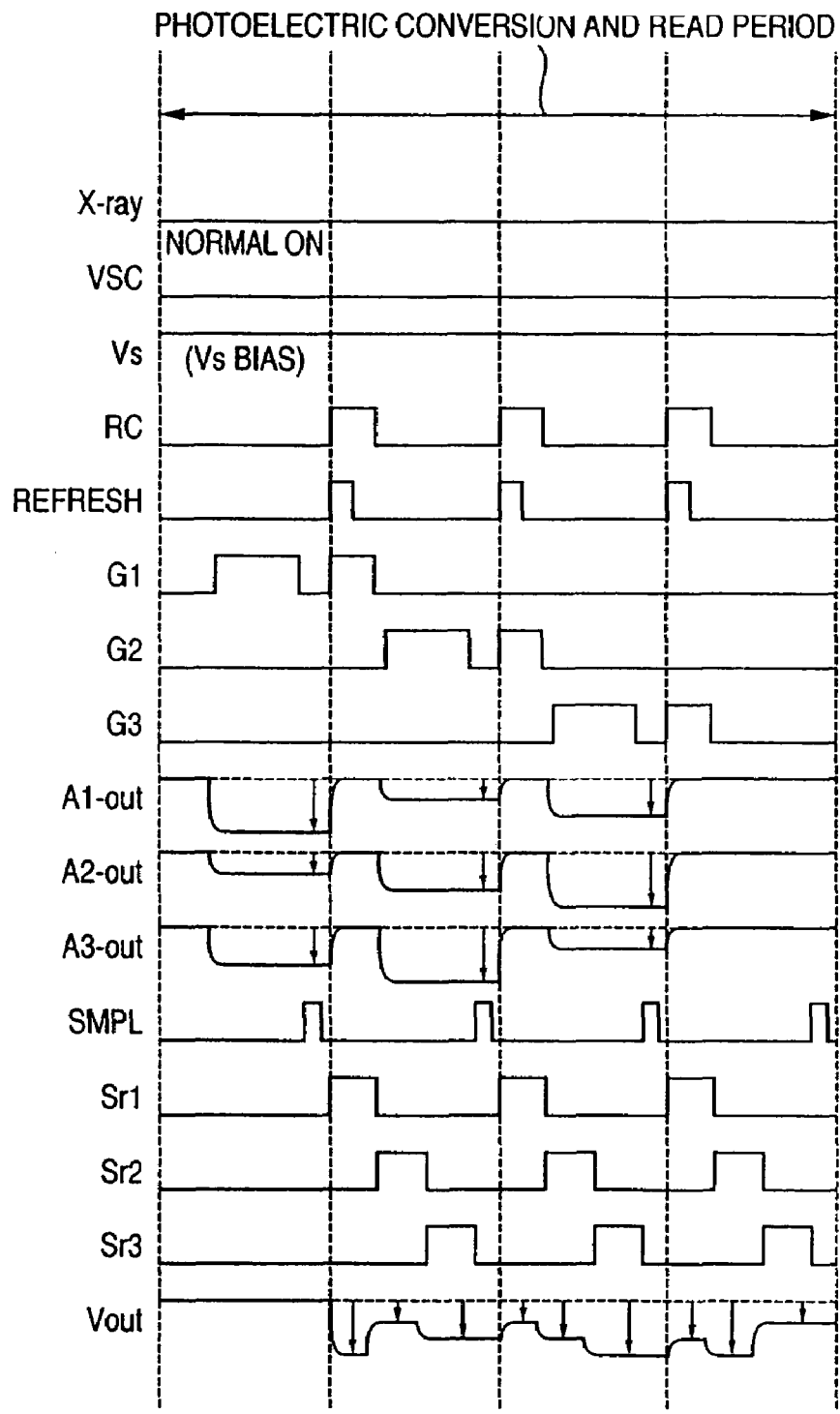
FIG. 21 is another timing chart of the fluoroscopy mode in FIG. 19.

FIG. 21 is another timing chart in the fluoroscopy mode shown in FIG. 19, which is different from FIG. 20. The difference from FIG. 20 is that the subject is not irradiated with X-rays as pulses. Since the read and photoelectric conversion can be executed in the same period, the operation frequency in the fluoroscopy mode can be increased. In addition, since no X-rays as pulses are used, the load on the X-ray generation source can be reduced.

When the X-ray imaging apparatus of the present invention is applied to a fluoroscopic apparatus, continuous images are acquired in the fluoroscopy mode while executing refresh from the switch side of a read circuit section 21 through TFTs. When positioning is ended by fluoroscopy, and the fluoroscopy mode is changed to the still image mode, refresh can be executed from the switch SW-F to obtain a still image having a high S/N ratio. That is, generally, the efficiency is higher and the S/N ratio is also higher in refresh from the switch SW-F side than in refresh from the TFT side. It is reasonable that in obtaining a fluoroscopic positioning image that allows a relatively low S/N ratio, refresh from the side of the switch of the read circuit section 21 is employed. On the other hand, in obtaining a still image that requires a high S/N ratio and high image quality, refresh from the switch SW-F side is employed.

(Fifth Embodiment)

Figure 23:
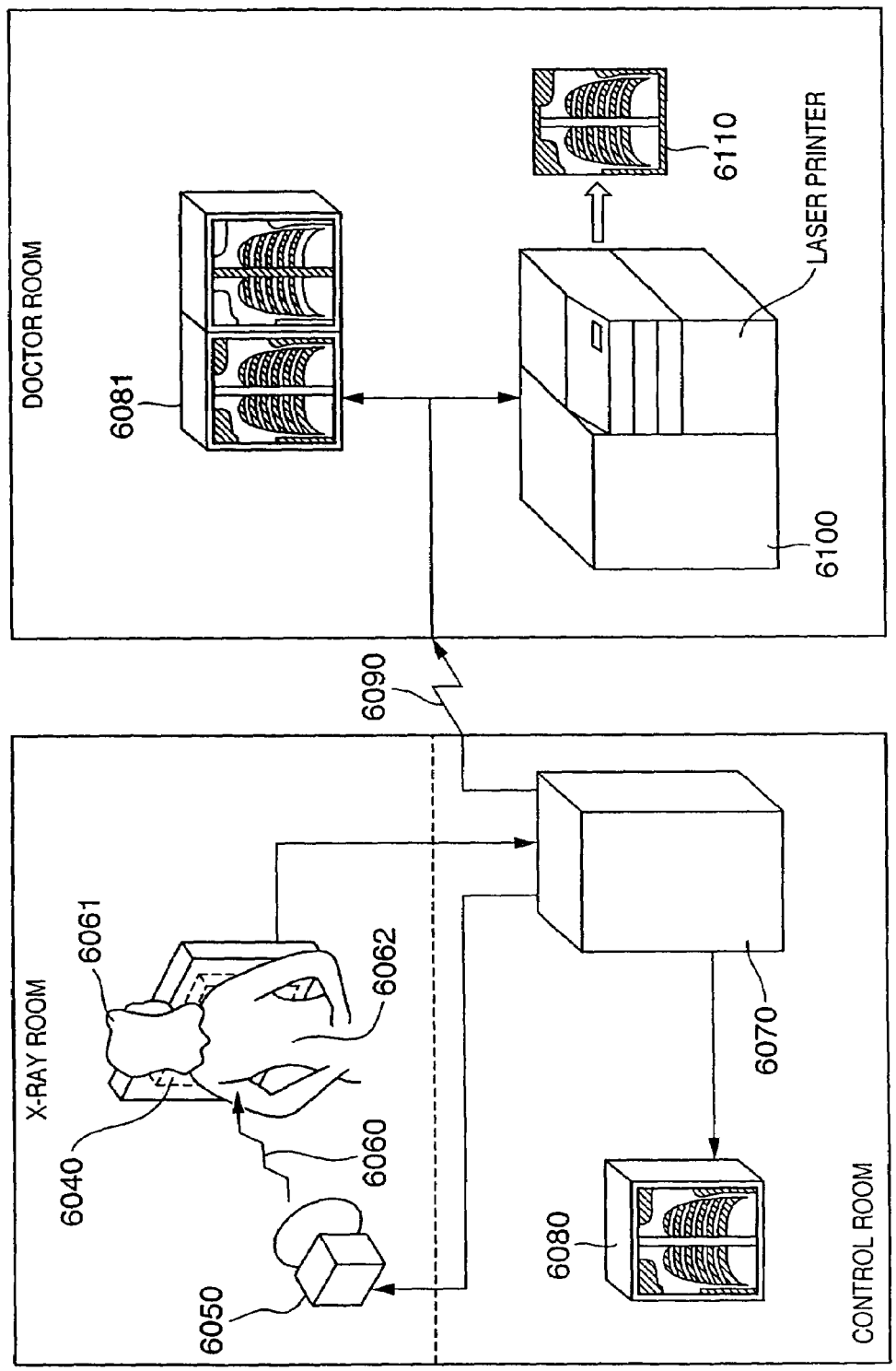
FIG. 23 is a schematic view showing an application example of the radiographic apparatus according to the present invention to an X-ray diagnostic system.
Figure 24:
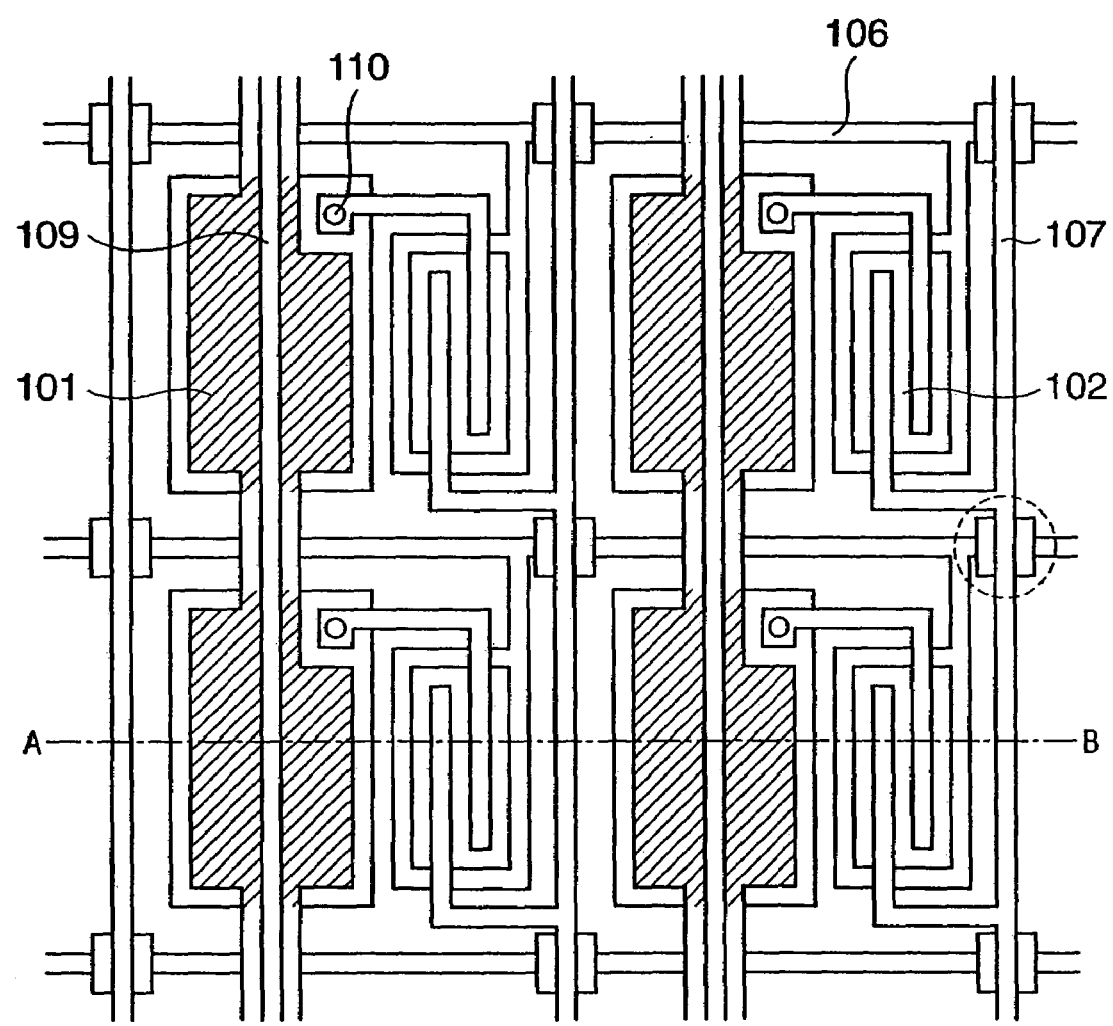
FIG. 24 is a plan view of a conventional photoelectric conversion substrate formed by using amorphous silicon semiconductor thin films as the materials of a photoelectric conversion element and a switch element.
Figure 25:
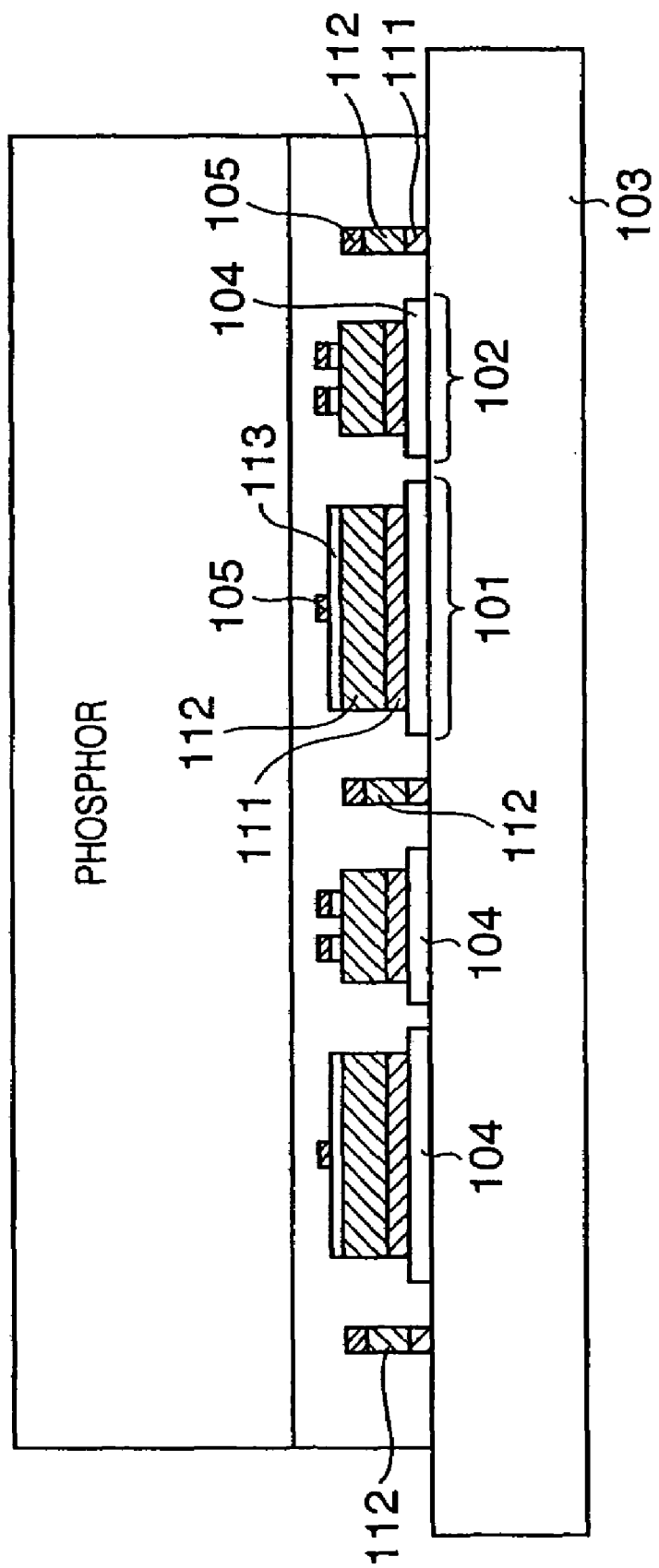
FIG. 25 is a sectional view taken along a line A-B in FIG. 24.
Figure 26:
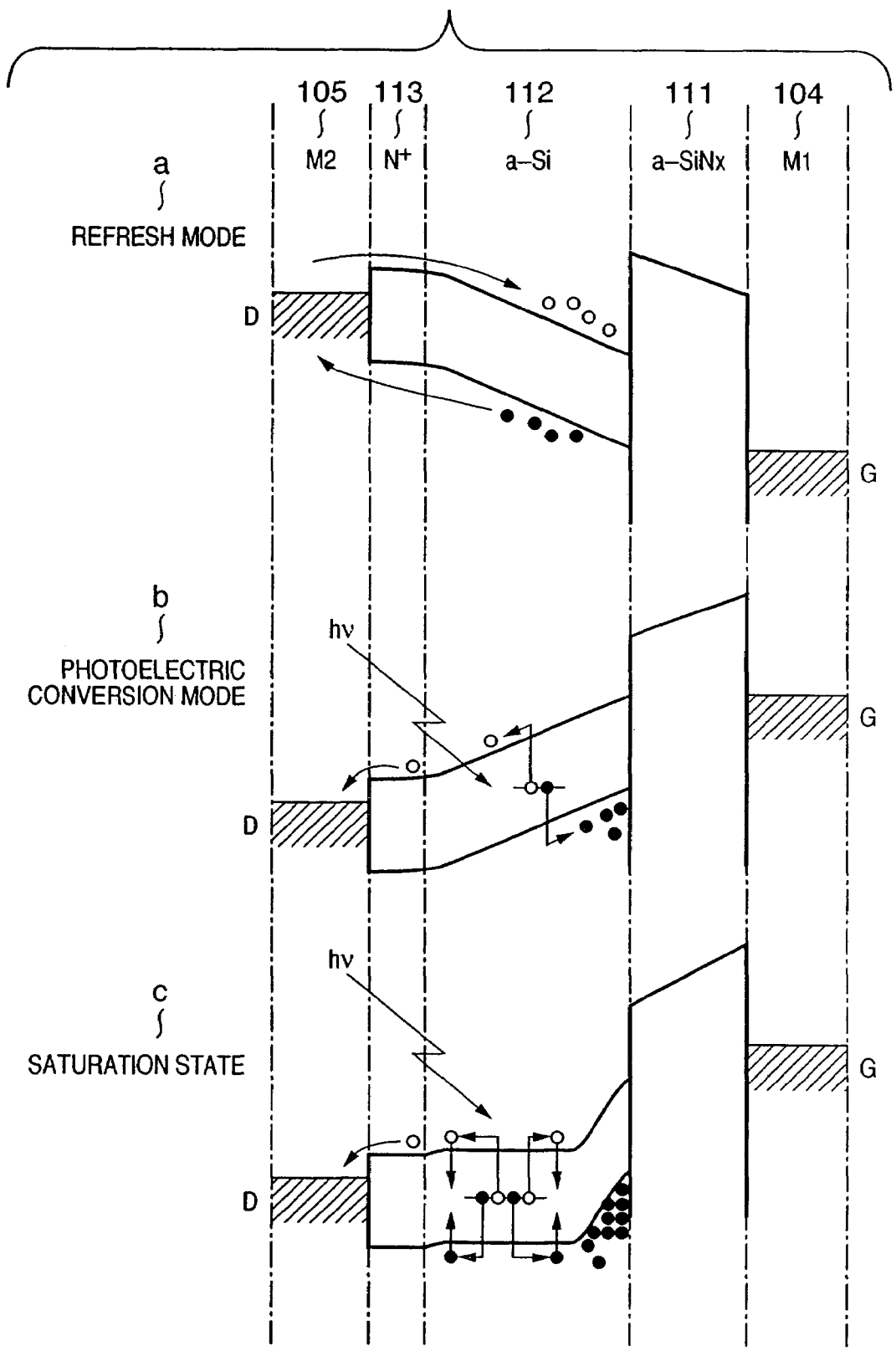
FIG. 26 is a graph showing energy bands so as to explain the device operation of the photoelectric conversion element shown in FIGS. 24 and 25.
Figure 27:
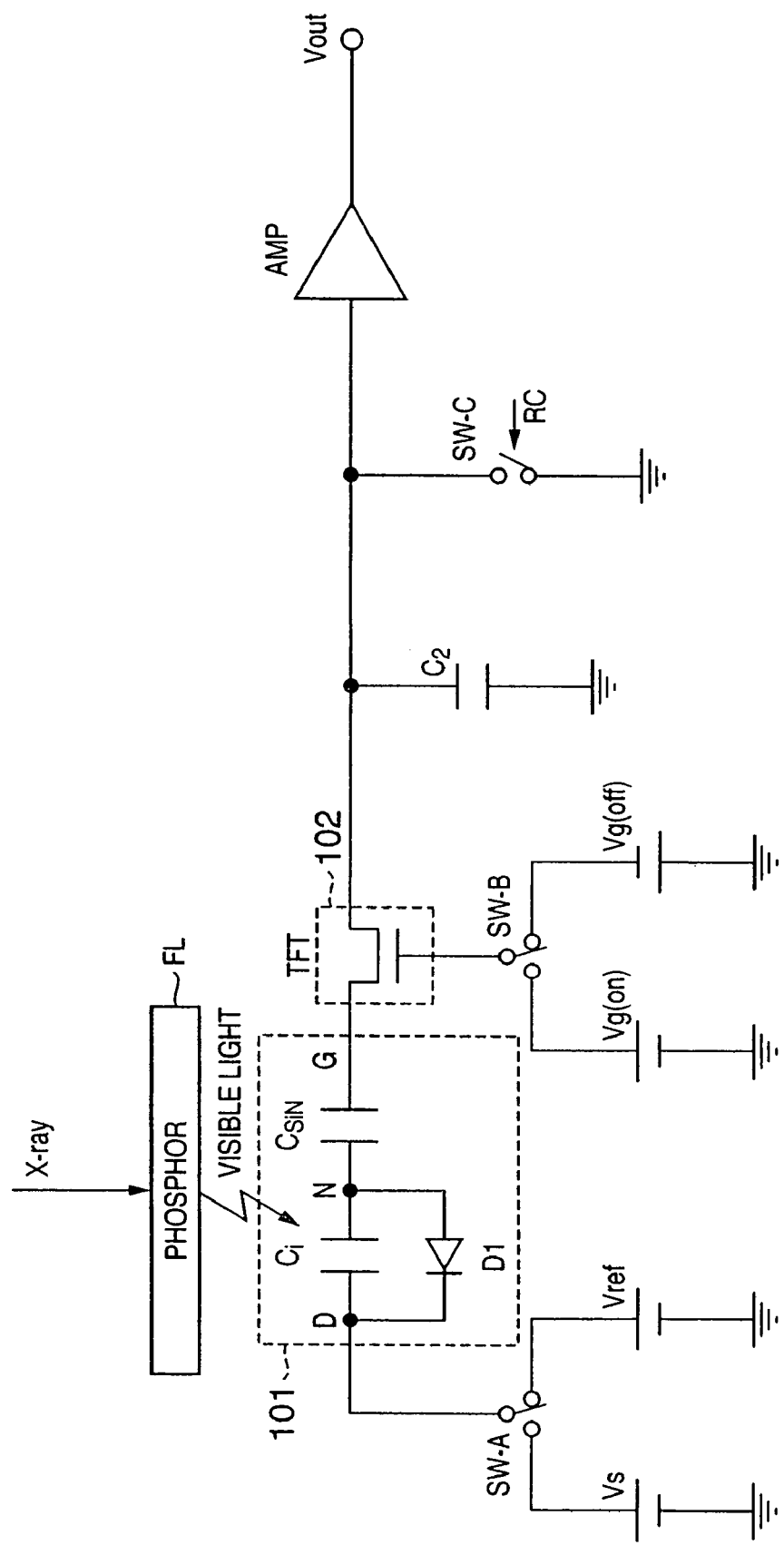
FIG. 27 is a circuit diagram showing a conventional photoelectric conversion circuit corresponding to one pixel having a photoelectric conversion element and a TFT.

FIG. 23 is a schematic view showing an application example of the radiographic apparatus according to the present invention to an X-ray diagnostic system.

X-rays 6060 generated by an X-ray tube 6050 are transmitted through a breast part 6062 of a patient or examination subject 6061 and become incident on a radiographic apparatus (image sensor) 6040. The incident X-rays contain the internal information of the examination subject 6061. In accordance with the incidence to the X-rays, they are converted into visible light. The visible light is photoelectrically converted to obtain an electrical signal. This electrical signal is converted into a digital signal, subjected to image processing by an image processor 6070, and observed on a display 6080 in a control room.

The image information can be transferred to a remote site through a transmission device such as a telephone line 6090 and displayed on a display 6081 or stored in a storage device such as an optical disk at another site such as a doctor room so that a doctor who is at the remote site can also diagnose the image. The image information can also be recorded on a film 6110 by using a film processor 6100.

An X-ray imaging system has been described in the above embodiments. However, the present invention can also be applied to an apparatus which converts radiation such as α-, β-, or γ-rays into light and photoelectrically converts the light.

The photoelectric conversion element array of the present invention can also be used in a normal imaging apparatus for detecting visible light or infrared light. As a switching element that can be used in the present invention, a thin film transistor whose channel region is formed by using an amorphous semiconductor such as hydrogenated amorphous silicon is preferably used. The form of the transistor is not limited to a lower gate stagger type. An upper gate stagger or upper gate coplanar type may also be used.

According to the radiographic apparatus according to each of the above embodiments, the conversion elements are sequentially refreshed for each row. Since the frame frequency in acquiring moving images can be increased, the moving images can be obtained at a high speed. In addition, as compared to a case wherein all the conversion elements are refreshed at once, the dark current (transient current) in the refresh mode can be made small. Hence, the voltage variation in GND or power supply line can be suppressed. Also, the wait time necessary for relaxing the voltage variation can be omitted.

As another characteristic feature of the above embodiments, since the conversion elements and switch elements are made of an amorphous silicon semiconductor, the conversion elements and switch elements can be formed on the same substrate in the same step by a very simple process. For this reason, a very inexpensive X-ray imaging apparatus can be provided at a high yield. In addition, an obtained moving image can be extracted as an electrical signal by photoelectrical conversion and therefore can easily be converted into digital data. When the digital information is, e.g., recorded or displayed for diagnosis of a person or object to be examined, the diagnosis can be very efficiently executed in terms of time and cost as compared to analog information. Hence, a more advanced medical environment than now can be established in the future aging and IT society.

As many apparently widely different embodiments of the present invention can be made without departing from the spirit and scope thereof, it is to be understood that the invention is not limited to the specific embodiments thereof except as defined in the appended claims.

What is claimed is:

1. An imaging apparatus comprising:
   a plurality of pixels arrayed in a row direction and in a column direction, and each including a conversion element that converts incident light into an electrical signal and a switch element that is connected to the conversion element and transfers the electrical signal;
   a plurality of control interconnections each connected to each of the plurality of switch elements arrayed in the row direction;
   a plurality of signal interconnections each connected to each of the plurality of switch elements arrayed in the column direction;
   a refresh device which is connected to said plurality of signal interconnections and applies a first bias to said plurality of signal interconnections for refreshing the conversion elements of each row; and
   a reset device which is connected to said plurality of signal interconnections and applies a second bias to said plurality of signal interconnections for resetting said plurality of signal interconnections.

2. The apparatus according to claim 1, further comprising:
   a driving circuit section which is connected to the plurality of control interconnections, and supplies driving signals to the plurality of control interconnections; and
   a read circuit section which is connected to the plurality of signal interconnections for reading out the electrical signals from the plurality of conversion elements row by row, said read circuit section including said refresh device and said reset device.

3. The apparatus according to claim 2, wherein said read circuit section further includes an amplifier that amplifies the electrical signal read out to the signal interconnection, a storage device which temporarily stores the amplified electrical signal, and a serial conversion device which serially converts the stored electrical signal.

4. The apparatus according to claim 2, wherein, after the read is executed, said read circuit section turns on the switch element, and drives said refresh device to refresh the conversion elements row by row, and then, drives the reset device to reset the signal interconnection.

5. The apparatus according to claim 1, wherein the conversion element and the switch element contain amorphous silicon.

6. The apparatus according to claim 1, wherein the conversion element and the switch element are formed on the same substrate in the same step.

7. The apparatus according to claim 1, wherein
   said conversion element comprises a first metal thin-film layer that is formed on a substrate as a lower electrode, an insulating layer that is formed on said first metal thin-film layer and made of amorphous silicon nitride that inhibits passage of electrons and holes, a photoelectric conversion layer that is made of hydrogenated amorphous silicon and formed on said insulating layer, an n-type injection inhibiting layer that is formed on said photoelectric conversion layer and inhibits injection of the holes, and a transparent conductive layer that is formed on said injection inhibiting layer as an upper electrode or a second metal thin-film layer that is formed on part of said injection inhibiting layer,
   said switch element is formed on the same substrate as that of the conversion element and comprises a first metal thin-film layer that is formed on the substrate as a lower gate electrode, a gate insulating layer that is formed on said first metal thin-film layer and made of amorphous silicon nitride, a semiconductor layer that is made of hydrogenated amorphous silicon and formed on said gate insulating layer, an n-type ohmic contact layer that is formed on said semiconductor layer, and a transparent conductive layer or a second metal thin-film layer that is formed on said ohmic contact layer as a source/drain electrode,
   in a refresh mode, an electric field is applied to the conversion element in a direction to guide the holes from said photoelectric conversion element to said second metal thin-film layer,
   in a photoelectric conversion mode, an electric field is applied to said conversion element in a direction to make the holes generated by the light that is incident on said photoelectric conversion layer stay in said photoelectric conversion layer and guide the electrode to said second metal thin-film layer, and
   the holes that are stored in said photoelectric conversion layer or the electrons that are guided to said second metal thin-film layer in the photoelectric conversion mode are detected as an optical signal.

8. The apparatus according to claim 1, further comprising a bias interconnection which applies a bias to the conversion element.

9. The apparatus according to claim 8, wherein said conversion element has at least two electrodes comprising a first electrode connected to the switch element and a second electrode connected to said bias interconnection, in a moving image mode, said read circuit section turns on the switch element and drives the refresh device to execute the refresh operation of the photoelectric conversion element, and in a still image mode, the bias is switched by a second switch connected to said bias interconnection to execute the refresh operation of the conversion element.

10. A method of driving an imaging apparatus including a plurality of pixels arrayed in a row direction and in a column direction, and each including a conversion element that converts incident light into an electrical signal and a switch element that is connected to the conversion element and transfers the electrical signal, and a plurality of signal interconnections each connected to each of the plurality of switch elements arrayed in the column direction, said method comprising the steps of:

driving the switches of a predetermined row and transferring electrical signals converted by the conversion elements of the predetermined row;

driving the switches of the predetermined row and refreshing the conversion elements of the predetermined row;

driving the switches and resetting the plurality of signal interconnections; and driving the switches of a next row of the predetermined row and transferring electrical signals converted by the conversion elements of the next row.

11. The method according to claim 10, wherein said imaging apparatus further includes a plurality of control interconnections each connected to each of the plurality of switch elements arrayed in the row direction, a driving circuit section which is connected to the plurality of control interconnections, and supplies driving signals to the plurality of control interconnections, and a read circuit section which is connected to the plurality of signal interconnections for reading out the electrical signals from the plurality of conversion elements row by row.

12. The method according to claim 10, wherein said imaging apparatus further includes a refresh device which is connected to said plurality of signal interconnections and applies a first bias to said plurality of signal interconnections for refreshing the conversion elements of each row, and a reset device which is connected to said plurality of signal interconnections and applies a second bias to said plurality of signal interconnections for resetting said plurality of signal interconnections.

* * * * *

UNITED STATES PATENT AND TRADEMARK OFFICE
CERTIFICATE OF CORRECTION

| | |
|---|---|
| PATENT NO. | : 7,109,492 B2 |
| APPLICATION NO. | : 11/387794 |
| DATED | : September 19, 2006 |
| INVENTOR(S) | : Tadao Endo |

It is certified that error appears in the above-identified patent and that said Letters Patent is hereby corrected as shown below:

<u>On the Title Page</u>

"Item (75) Inventor:" Change "Tokyo" to --Saitama--.

Signed and Sealed this

Thirtieth Day of January, 2007

JON W. DUDAS
*Director of the United States Patent and Trademark Office*